United States Patent
Paek et al.

(10) Patent No.: US 9,048,241 B2
(45) Date of Patent: Jun. 2, 2015

(54) SEMICONDUCTOR DEVICE UTILZING REDISTRIBUTION LAYERS TO COUPLE STACKED DIE

(71) Applicants: Jong Sik Paek, Incheon (KR); Doo Hyun Park, Gyeonggi-do (KR); Seong Min Seo, Seoul (KR); Won Chul Do, Gyeonggi-do (KR); Pil Je Sung, Seoul (KR); Jin Hee Park, Seoul (KR); Do Hyung Kim, Seoul (KR); In Bae Park, Seoul (KR); Chang Min Lee, Busan (KR); Yong Song, Seoul (KR); SungGeun Kang, Gyeonggi-do (KR)

(72) Inventors: Jong Sik Paek, Incheon (KR); Doo Hyun Park, Gyeonggi-do (KR); Seong Min Seo, Seoul (KR); Won Chul Do, Gyeonggi-do (KR); Pil Je Sung, Seoul (KR); Jin Hee Park, Seoul (KR); Do Hyung Kim, Seoul (KR); In Bae Park, Seoul (KR); Chang Min Lee, Busan (KR); Yong Song, Seoul (KR); SungGeun Kang, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/063,394

(22) Filed: Oct. 25, 2013

(65) Prior Publication Data
US 2015/0014830 A1    Jan. 15, 2015

(30) Foreign Application Priority Data
Jul. 13, 2013  (KR) .......................... 10-2013-0084185

(51) Int. Cl.
*H01L 23/02*     (2006.01)
*H01L 23/538*    (2006.01)
*H01L 25/00*     (2006.01)

(52) U.S. Cl.
CPC ............ *H01L 23/5386* (2013.01); *H01L 25/50* (2013.01)

(58) Field of Classification Search
CPC .......... H01L 2924/01078; H01L 2924/01079; H01L 2924/01029; H01L 2924/01013; H01L 2924/14
USPC ................ 257/685–686, 777, 778–781, 784, 257/787–790
See application file for complete search history.

(56) References Cited

U.S. PATENT DOCUMENTS

2012/0018895 A1*  1/2012  Oganesian et al. ........... 257/773

FOREIGN PATENT DOCUMENTS

KR    1020040071960    8/2004
KR    1020100002858    1/2010

\* cited by examiner

*Primary Examiner* — Hoa B Trinh
(74) *Attorney, Agent, or Firm* — McAndrews, Held & Malloy

(57) ABSTRACT

A semiconductor device utilizing redistribution layers to couple stacked die is disclosed and may include a first semiconductor die with a first surface comprising bond pads, a second surface opposite the first surface, and sloped side surfaces between the first and second surfaces, such that a cross-section of the first die is trapezoidal in shape. A second semiconductor die with a first surface may be bonded to the second surface of the first die, wherein the first surface of the second die may comprise bond pads. A passivation layer may be formed on the first surface and sloped side surfaces of the first die and the first surface of the second die. A redistribution layer may be formed on the passivation layer, electrically coupling bond pads on the first and second die. A conductive pillar may extend from a bond pad on the second die to the second redistribution layer.

20 Claims, 21 Drawing Sheets

SEMICONDUCTOR DEVICE UTILZING REDISTRIBUTION LAYERS TO COUPLE STACKED DIE

CROSS REFERENCE TO RELATED APPLICATIONS

The present application makes reference to, claims priority to, and claims the benefit of Korean Patent Application No. 10-2013-0084185, filed on Jul. 17, 2013, the contents of which are hereby incorporated herein by reference, in their entirety.

FIELD OF THE INVENTION

Certain example embodiments of the disclosure relate to semiconductor chip packaging. More specifically, certain example embodiments of the disclosure relate to a semiconductor device utilizing redistribution layers to couple stacked die.

BACKGROUND

Along with the demand for miniaturized and high-capacity electric/electronic products, a wide variety of techniques for providing high-capacity semiconductor devices are researched and developed. One of the techniques for providing high-capacity semiconductor devices is to stack semiconductor dies. In stacking the semiconductor dies, a memory chip is stacked on a logic chip, and the memory chip and the logic chip are connected to each other using a conductive wire or a conductive bump.

However, when a conductive wire or a conductive bump is used in electrically connecting semiconductor chips, a process of applying heat is required, making it difficult to employ this technique on a wafer level.

Further limitations and disadvantages of conventional and traditional approaches will become apparent to one of skill in the art, through comparison of such systems with the present invention as set forth in the remainder of the present application with reference to the drawings.

BRIEF SUMMARY

A semiconductor device utilizing redistribution layers to couple stacked die, substantially as shown in and/or described in connection with at least one of the figures, as set forth more completely in the claims.

Various advantages, aspects and novel features of the present invention, as well as details of various illustrated example supporting embodiments, will be more fully understood from the following description and drawings.

DETAILED DESCRIPTION

Certain aspects of the disclosure may be found in a semiconductor device utilizing redistribution layers to couple stacked die. Example aspects of the disclosure may comprise a first semiconductor die with a first surface comprising bond pads, a second surface opposite the first surface, and sloped side surfaces between the first and second surfaces, such that a cross-section of the first semiconductor die is trapezoidal in shape. A second semiconductor die or a circuit board with a first surface may be bonded to the second surface of the first semiconductor die, wherein the first surface of the second semiconductor die may comprise bond pads. A passivation layer may be formed on the first surface and sloped side surfaces of the first semiconductor die and the first surface of the second semiconductor die or circuit board. A redistribution layer may be formed on the passivation layer formed on the first surface and sloped side surfaces of the first semiconductor die and the first surface of the second semiconductor die or circuit board, with the redistribution layer electrically coupling at least one bond pad on the first surface of the first semiconductor die to a bond pad on the first surface of the second semiconductor die. An encapsulant material may encapsulate the first semiconductor die, the redistribution layer, and the first surface of the second semiconductor die. A second redistribution layer may be formed on the encapsulant material. A conductive pillar may extend from a bond pad on the first surface of the second semiconductor die to the second redistribution layer. A solder ball may be formed on the second redistribution layer. A conductive pillar may extend from a bond pad on the first surface of the second semiconductor die to a top surface of the encapsulant material. A solder ball may be formed on the conductive pillar at the top surface of the encapsulant material. A circuit board may be electrically coupled to the bond pad on the first surface of the second semiconductor utilizing the solder ball and the conductive pillar.

Figure 1:
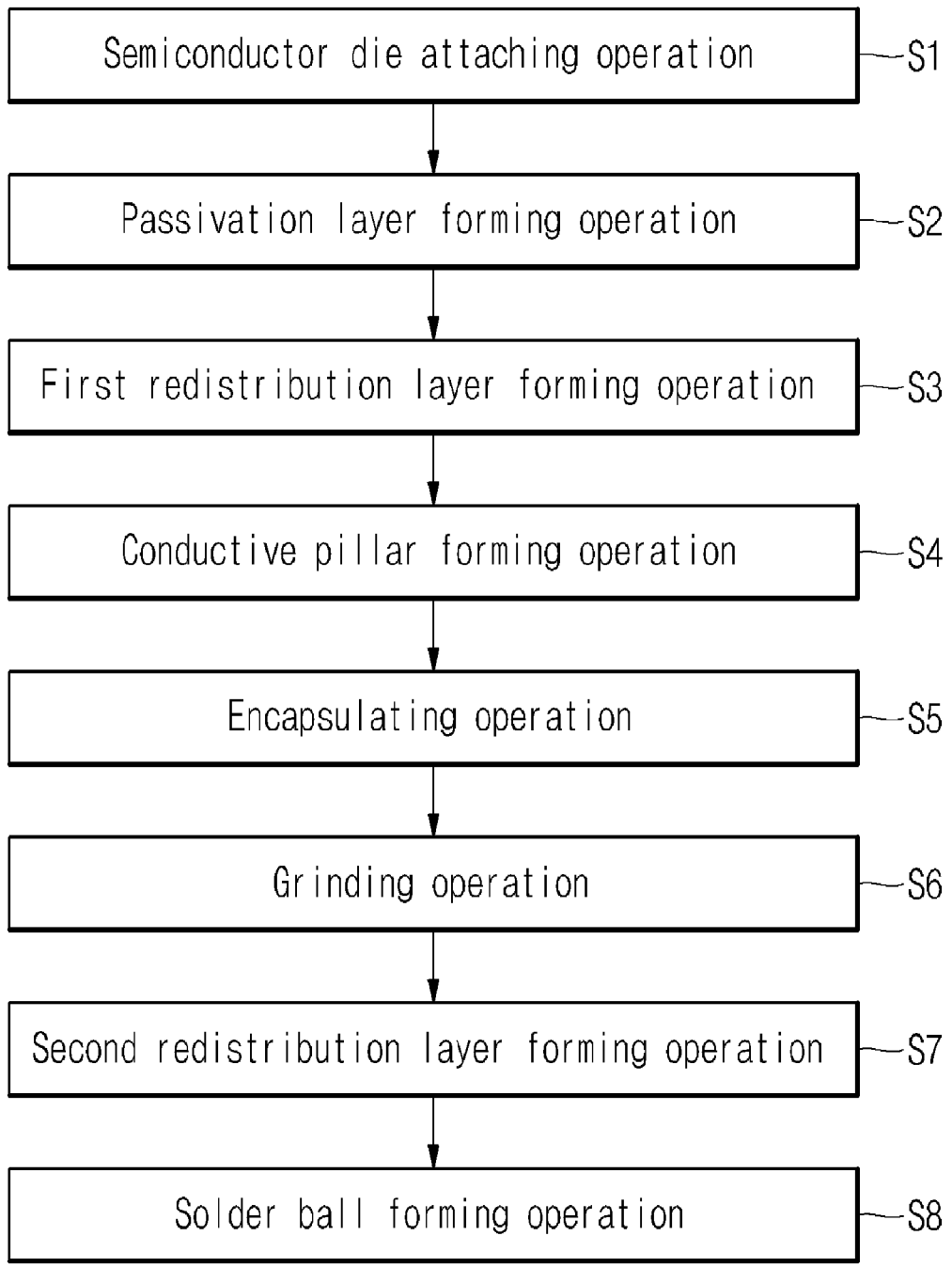
FIG. 1 is a flowchart illustrating a fabricating method of a semiconductor device according to an example embodiment of the present disclosure.

FIG. 1 is a flowchart illustrating a fabricating method of a semiconductor device according to an example embodiment of the present disclosure, and FIGS. 2A to 2H are cross-sectional views illustrating the fabricating method shown in FIG. 1.

In accordance with an aspect of the present disclosure, there is provided a fabricating method of a semiconductor device, the fabricating method including providing a first semiconductor die and a second semiconductor die, the first semiconductor die including a first surface, a second surface opposite to the first surface and a plurality of first bond pads formed on the first surface, and the second semiconductor die including a first surface, and a second surface opposite to the first surface. An inclined surface may connect the first surface and the second surface and a plurality of second bond pads may be formed on the first surface, and the second semiconductor die may be attached to the first surface of the first semiconductor die. A passivation layer may be formed on the first surface of the first semiconductor die, the first surface of the second semiconductor die and the inclined surface so as to expose the first bond pads and the second bond pads to the outside. A first redistribution layer may be formed on the passivation layer to electrically connect the first bond pads to the second bond pads. A conductive pillar may be formed on the first bond pads and/or the second bond pads, and the second semiconductor die, the passivation layer, the first redistribution layer and the conductive pillar on the first semiconductor die may be encapsulated, using an encapsulant. A top portion of the encapsulant may be ground down to expose the conductive pillar to the outside, and a second redistribution layer may be formed on the encapsulant and electrically connected to the conductive pillar.

In the attaching of the second semiconductor die to the first surface of the first semiconductor die, a plurality of second semiconductor dies may be attached to the first surface of the first semiconductor die in the form of a wafer. The first redistribution layer may be formed to extend from the first surface of the first semiconductor die to the inclined surface and the first surface of the second semiconductor die. The conductive pillar may be formed on the first bond pads and the second bond pads, which might not be electrically connected by the first redistribution layer. Here, a height of the conductive pillar may be greater than that of the second semiconductor die. In the grinding, a portion of the conductive pillar may also be ground to allow a top surface of the conductive pillar and a top surface of the encapsulant to be coplanar.

In the forming of the second redistribution layer, a first passivation layer may be formed on the encapsulant to expose the portion of the conductive pillar and a second redistribution layer may be formed on the first passivation layer. Additionally, a second passivation layer may be formed on the first passivation layer to expose a portion of the second redistribution layer. After the forming of the second redistribution layer, the fabricating method may further include attaching solder balls to the second redistribution layer. After the attaching of the solder balls, the fabricating method may further include sawing the first semiconductor die using a sawing tool.

In accordance with another aspect of the present disclosure, there is provided a semiconductor device including a first semiconductor die including a first surface, a second surface opposite to the first surface and a plurality of first bond pads formed on the first surface; and a second semiconductor die including a first surface, a second surface opposite to the first surface, an inclined surface connecting the first surface and the second surface and a plurality of second bond pads formed on the first surface. A passivation layer may be formed on the first surface of the first semiconductor die, the first surface of the second semiconductor die and the inclined surface of the second semiconductor die. The passivation layer may expose the first bond pads and the second bond pads to the outside, and a first redistribution layer may be formed on the passivation layer electrically connecting the first bond pads to the second bond pads. A conductive pillar may be formed on the first bond pads and/or the second bond pads where the first redistribution layer is not formed. The second semiconductor die, the passivation layer, the first redistribution layer and the conductive pillar, which are positioned on the first semiconductor die, may be encapsulated with an encapsulant that may expose the conductive pillar to the outside. A second redistribution layer may be formed on the encapsulant and electrically connected to the conductive pillar, and solder balls may be formed on the second redistribution layer.

In accordance with still another aspect of the present disclosure, there is provided a fabricating method of a semiconductor device, the fabricating method including providing a first semiconductor die and a second semiconductor die, the first semiconductor die including a first surface, a second surface opposite to the first surface and a plurality of first bond pads formed on the first surface, and the second semiconductor die including a first surface, a second surface opposite to the first surface, an inclined surface connecting the first surface and the second surface and a plurality of second bond pads formed on the first surface. The second semiconductor die may be attached to the first surface of the first semiconductor die. A passivation layer may be formed on the first surface of the first semiconductor die, the first surface of the second semiconductor die and the inclined surface so as to expose the first bond pads and the second bond pads to the outside. A first redistribution layer may be formed on the passivation layer to electrically connect the first bond pads to the second bond pads and a conductive pillar may be formed on the first bond pads and/or the second bond pads. The second semiconductor die, the passivation layer, the first redistribution layer and the conductive pillar, which are positioned on the first semiconductor die, may be encapsulated using an encapsulant. A top portion of the encapsulant may be ground down to expose the conductive pillar to the outside. Conductive bumps may be formed on the conductive pillar and a circuit board may be attached to the conductive bumps.

A plurality of second semiconductor die may be attached to the first surface of the first semiconductor die in the form of a wafer. The first redistribution layer may be formed to extend from the first surface of the first semiconductor die to the inclined surface and the first surface of the second semiconductor die. The conductive pillar may be formed on the first bond pads and the second bond pads, which are not electrically connected by the first redistribution layer.

In the attachment of the circuit board, the circuit board may be prepared, where the circuit board includes an insulating layer, a first circuit pattern formed on a first surface of the insulating layer, and a second circuit pattern formed on a second surface opposite to the first surface of the insulating layer, and where solder balls may be attached to the second circuit pattern. The circuit board may be attached to the conductive bumps to electrically connect the first circuit pattern to the conductive bumps.

In accordance with yet another aspect of the present disclosure, there is provided a semiconductor device including a circuit board having an insulating layer, a first circuit pattern formed on a first surface of the insulating layer, and a second circuit pattern formed on a second surface opposite to the first surface of the insulating layer. A semiconductor die may be mounted on a first surface of the circuit board and include a first surface, a second surface opposite to the first surface, an inclined surface connecting the first surface and the second surface and a plurality of bond pads formed on the first surface. A passivation layer may be formed on the first surface of the circuit board and the first surface of the semiconductor die and exposing the first circuit pattern and the bond pads to the outside. A redistribution layer may be formed on the passivation layer and electrically connect the first circuit pattern to the bond pads. The semiconductor die, the passivation layer and the redistribution layer, which are positioned on the circuit, may be encapsulated using an encapsulant and solder balls may be attached to the second circuit pattern.

The passivation layer may be formed to cover all of the first surface of the circuit board, the first surface of the semiconductor die and the inclined surface. The redistribution layer may be formed on the passivation layer to extend from the first surface of the circuit board to the inclined surface and the first surface of the semiconductor die. In addition, the redistribution layer may be formed to have a stepped portion. The passivation layer may be formed on the inclined surface of the semiconductor die to cover portions of the first surface of the semiconductor die and the first surface of the circuit board. The redistribution layer may be formed on the passivation layer to extend from the first surface of the circuit board to the inclined surface and the first surface of the semiconductor die. In addition, the redistribution layer may be formed to have a stepped portion.

The circuit board may further include a mounting groove formed on its first surface, and the semiconductor die may be mounted in the mounting groove. Here, a depth of the mounting groove may be equal to a height of the semiconductor die. The first surface of the circuit board and the first surface of the semiconductor die may be coplanar. The passivation layer may be formed between the inclined surface of the semiconductor die and the mounting groove. The redistribution layer may be flatly formed.

In accordance with a further aspect of the present disclosure, there is provided a fabricating method of a semiconductor device, the fabricating method including providing a circuit board and a semiconductor die, where the circuit board includes an insulating layer, a first circuit pattern formed on a first surface of the insulating layer, and a second circuit pattern formed on a second surface opposite to the first surface of the insulating layer. The semiconductor die may include a first surface, a second surface opposite to the first surface, an inclined surface connecting the first surface and the second surface, and a plurality of bond pads formed on the first surface. The semiconductor die may be attached to the first surface of the circuit board and a passivation layer may be formed on the first surface of the circuit board and the first surface of the semiconductor die to expose the first circuit pattern and the bond pads to the outside. A redistribution layer may be formed on the passivation layer to electrically connect the first circuit pattern to the bond pads. The passivation layer and the redistribution layer, which are positioned on the circuit board, may be encapsulated using an encapsulant, and solder balls may be attached to the second circuit pattern of the circuit board.

A plurality of semiconductor dies may be attached to the first surface of the circuit board in the form of a panel. The passivation layer may be formed to cover all of the first surface of the circuit board, the first surface of the semiconductor die and the inclined surface. The redistribution layer may be formed to extend from the first surface of the circuit board to the inclined surface and the first surface of the semiconductor die. After the attaching of the solder balls, the fabricating method may further include sawing the circuit board using a sawing tool.

As described above, in the fabricating method of the semiconductor device according to an example embodiment of the present disclosure, a first redistribution layer electrically connecting first bond pads to second bond pads may be formed, thereby electrically connecting a first semiconductor die to a second semiconductor die. Accordingly, in various aspects of the present disclosure, a process of applying heat, like in wire bonding or conductive bump attachment, is not required, so that wafer-level operations may be utilized, thereby achieving mass production.

In addition, in the fabricating method of the semiconductor device according to another example embodiment of the present disclosure, a redistribution layer may electrically connect a first circuit pattern to bond pads, thereby electrically connecting a circuit board to a semiconductor die. Accordingly, in various aspects of the present disclosure, a process of applying heat, like in wire bonding or conductive bump attachment, is not required, so that wafer-level operations may be utilized, thereby achieving mass production.

Referring now to FIG. 1, the fabricating method of the semiconductor device according to an example embodiment of the present disclosure includes a semiconductor die attaching operation (S1), a passivation layer forming operation (S2), a first redistribution layer forming operation (S3), a conductive pillar forming operation (S4), an encapsulating operation (S5), a grinding operation (S6), a second redistribution layer forming operation (S7) and a solder ball attaching (or forming) operation (S8). Hereinafter, various operations illustrated in FIG. 1 will be described with reference to FIGS. 2A to 2H.

The semiconductor die attaching operation (S1) may comprise attaching a second semiconductor die 120 to a first surface 111 of a first semiconductor die 110.

Figure 2A:
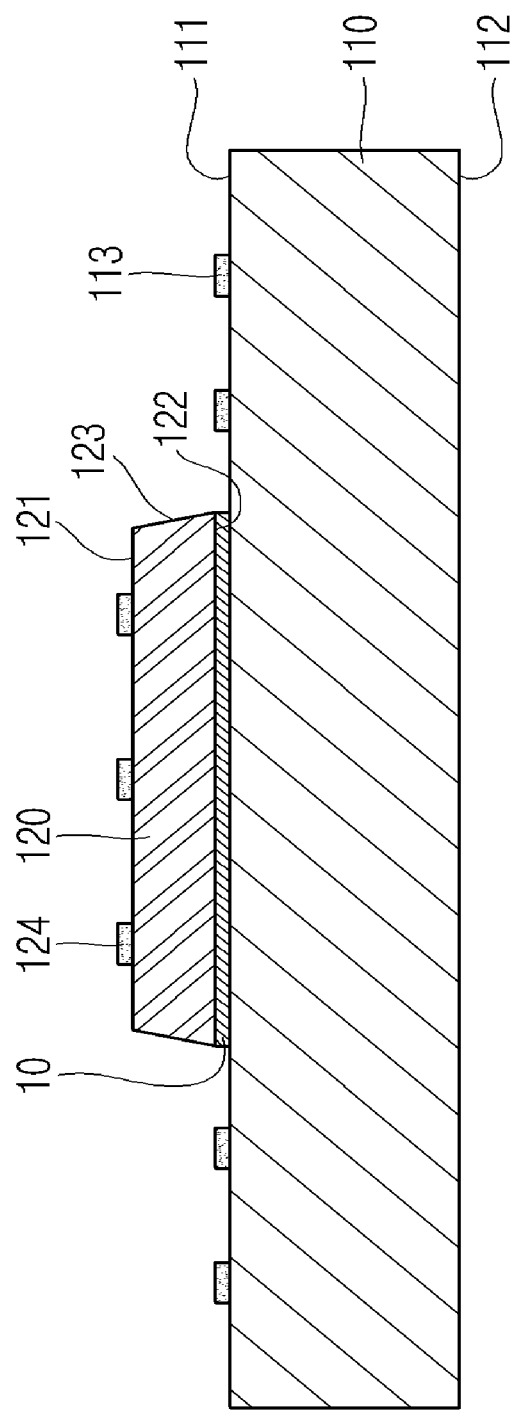
FIGS. 2A to 2H are cross-sectional views illustrating the fabricating method shown in FIG. 1, in accordance with an example embodiment of the present disclosure.

Referring to FIG. 2A, in the semiconductor die attaching operation (S1), a second semiconductor die 120 is attached to the first surface 111 of the first semiconductor die 110 using an adhesion member 10 (e.g., adhesive paste, adhesive tape, etc.). In FIG. 2A, one second semiconductor die 120 attached to the first semiconductor die 110 is illustrated. In practice, however, a plurality of second semiconductor dies 120 may be attached to the first semiconductor die 110 in the form of a wafer. That is to say, the semiconductor die attaching operation (S1) may comprise attaching a plurality of second semiconductor dies 120 to the first surface 111 of the first semiconductor die 110 in the form of a wafer.

The first semiconductor die 110 may be, for example, in wafer form. In addition, the first semiconductor die 110 may comprise silicon, and may be a logic chip having a plurality of semiconductor devices formed therein. The first semiconductor die 110 may comprise a first surface 111 that is planar, a second surface 112 that is planar and opposite to the first surface 111, and a plurality of first bond pads 113 formed on the first surface 111. The second semiconductor die 120 may comprise silicon, and may be a memory chip having a plurality of semiconductor devices formed therein. The second semiconductor die 120 may comprise a first surface 121 that is planar, a second surface 122 that is planar and opposite to the first surface 121, an inclined surface 123 connecting the first surface 121 and the second surface 122, and a plurality of second bond pads 124 formed on the first surface 121. That is to say, the second semiconductor die 120 may be trapezoidal, for example, and be wider at the second surface 122 compared to the first surface 121 (e.g., in one lateral direction or two orthogonal lateral directions). In the semiconductor die attaching operation (S1), the first semiconductor die 110 and the second semiconductor die 120 may be attached to each other such that the second surface 122 of the second semiconductor die 120 faces the first surface 111 of the first semiconductor die 110.

In the passivation layer forming operation (S2), a passivation layer 130 may be formed on the first semiconductor die 110 and the second semiconductor die 120.

Figure 2B:
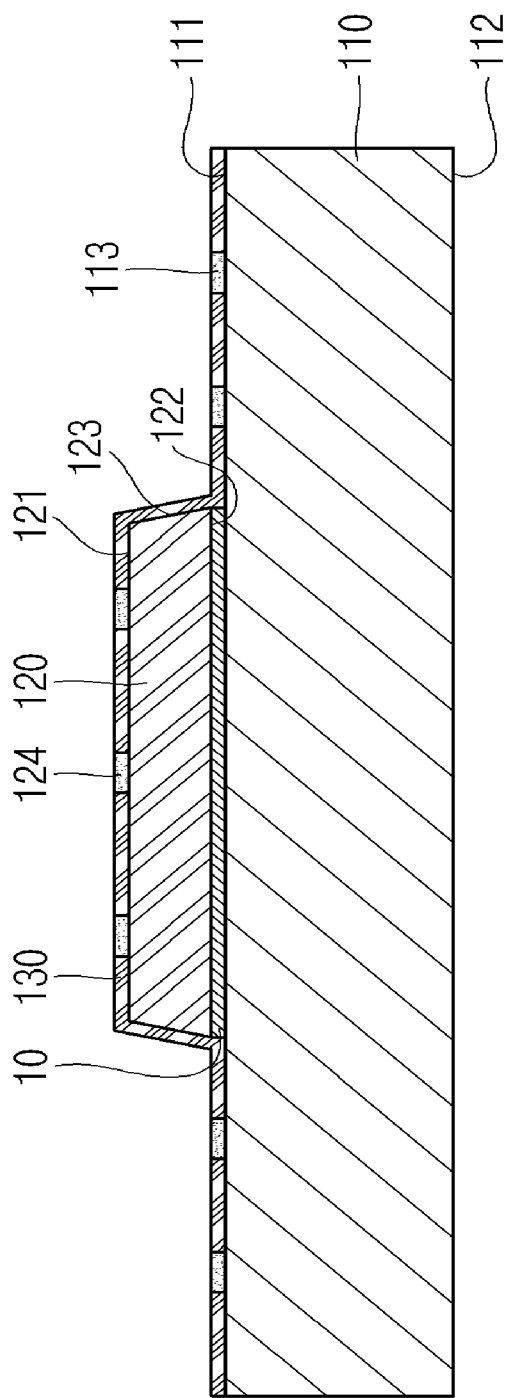

Referring to FIG. 2B, in the passivation layer forming operation (S2), the passivation layer 130 may be formed to cover the first surface 111 of the first semiconductor die 110 and the first surface 121 and the inclined surface 123 of the second semiconductor die 120. In addition, the passivation layer 130 may expose the first bond pads 113 and the second bond pads 124 to the outside. The passivation layer 130 may, for example, be generally made of one selected from the group consisting of polyimide, epoxy, benzo cyclo butane (BCB), poly benz oxazole (PBO), oxide, nitride, and equivalents thereof.

The first redistribution layer forming operation (S3) may comprise forming a first redistribution layer 140 electrically connecting at least some of the first bond pads 113 of the first semiconductor die 110 to at least some of the second bond pads 124 of the second semiconductor die 120.

Figure 2C:
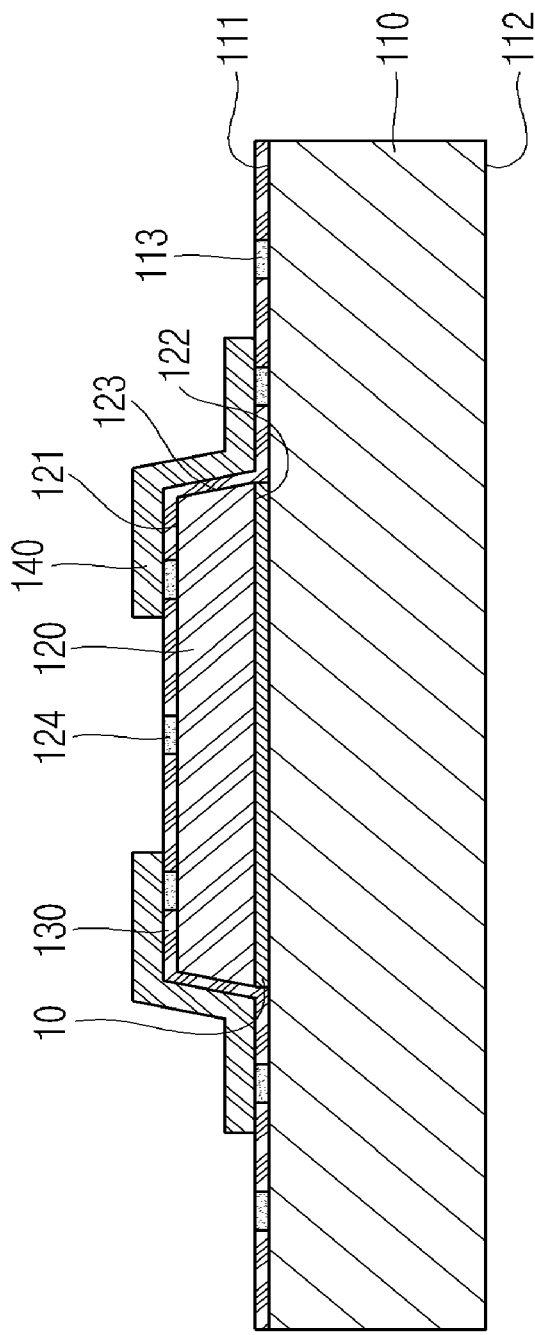

Referring to FIG. 2C, in the first redistribution layer forming operation (S3), the first redistribution layer 140 may be formed on a top surface of the passivation layer 130 to electrically connect at least some of the first bond pads 113 to at least some of the second bond pads 124. The first redistribution layer 140 may be formed on the top surface of the passivation layer 130 to extend from the first surface 111 of the first semiconductor die 110 to the inclined surface 123 and the first surface 121 of the second semiconductor die 120. Therefore, the first redistribution layer 140 may be formed to have a stepped portion. Here, since the second semiconductor die 120 has the inclined surface 123, it is relatively advantageous (e.g., from a manufacturability and/or quality perspective) to form the first redistribution layer 140 on the top surface of the passivation layer 130, for example as compared to a configuration in which the surface 123 is vertical.

In addition, a seed layer (not shown) may be formed between the first redistribution layer 140 and the passivation layer 130. For example, in the first redistribution layer forming operation (S3), the seed layer (not shown) may be formed on the passivation layer 130, a photoresist pattern may be coated on the seed layer, and the first redistribution layer 140 may then be formed on a portion without the photoresist pattern by plating or sputtering. Then, the seed layer of a portion without the first redistribution layer 140 and the photoresist pattern may be etched. The first redistribution layer 140 may be made of, for example, one material selected from the group consisting of copper (Cu), titanium (Ti), nickel (Ni), palladium (Pd) and equivalents thereof.

The conductive pillar forming operation (S4) may comprise forming a conductive pillar 150 on one or more of the first bond pads 113 and/or on one or more of the second bond pads 124.

Figure 2D:
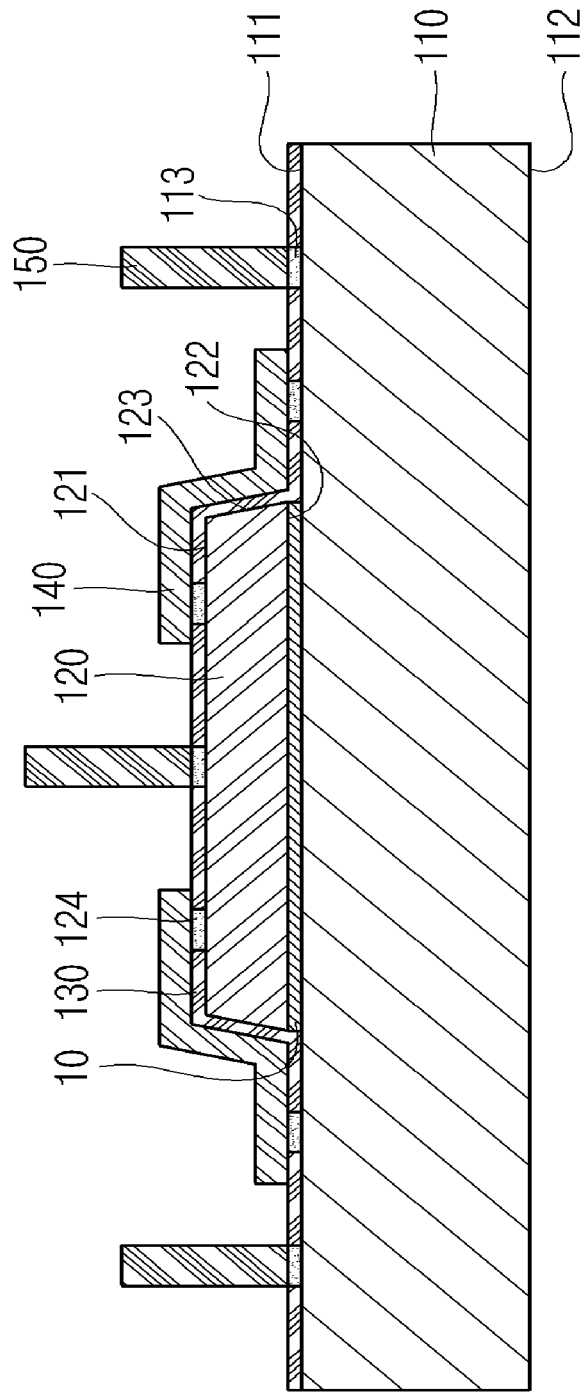

Referring to FIG. 2D, in the conductive pillar forming operation (S4), the conductive pillar 150 is formed on the first bond pads 113 and the second bond pads 124, where the first redistribution layer 140 is not formed. That is to say, the conductive pillar 150 may be formed on the first bond pads 113 and the second bond pads 124, which are not electrically connected by the first redistribution layer 140. The conductive pillar 150 may be, for example, a copper (Cu) pillar. In addition, a height of the conductive pillar 150 may be greater than that of the second semiconductor die 120 and/or greater than that of the first redistribution later 140.

The encapsulating operation (S5) may comprise encapsulating the second semiconductor die 120, the passivation layer 130, the first redistribution layer 140 and the conductive pillar 150, which are positioned on the first semiconductor die 110, using an encapsulant 160.

Figure 2E:
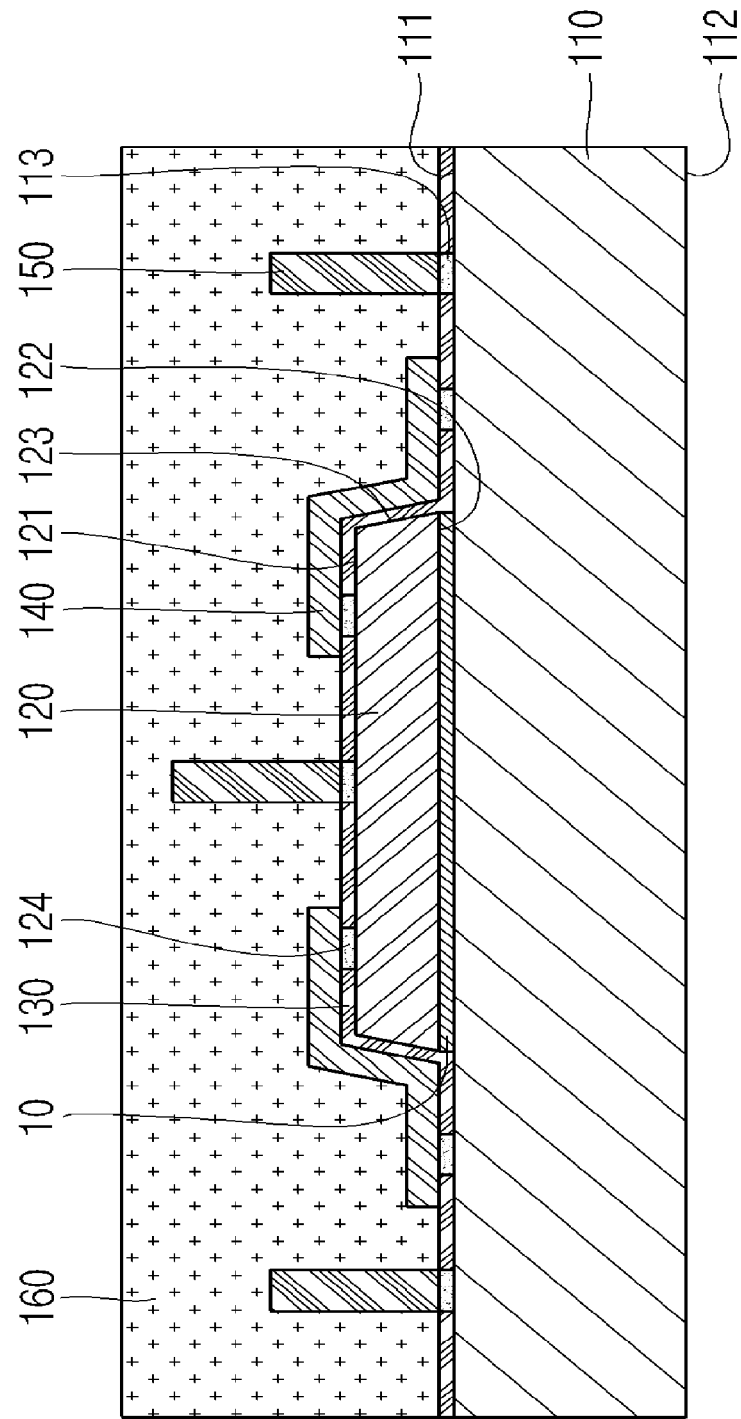

Referring to FIG. 2E, in the encapsulating operation (S5), the second semiconductor die 120, the passivation layer 130, the first redistribution layer 140 and the conductive pillar 150, which may be positioned on the first semiconductor die 110, and/or the second semiconductor die 120 may be encapsulated using the encapsulant 160, thereby protecting these components from external surroundings. The encapsulant 160 may be made of, for example, an epoxy-based resin.

The grinding operation (S6) may comprise grinding a portion of the encapsulant 160.

Figure 2F:
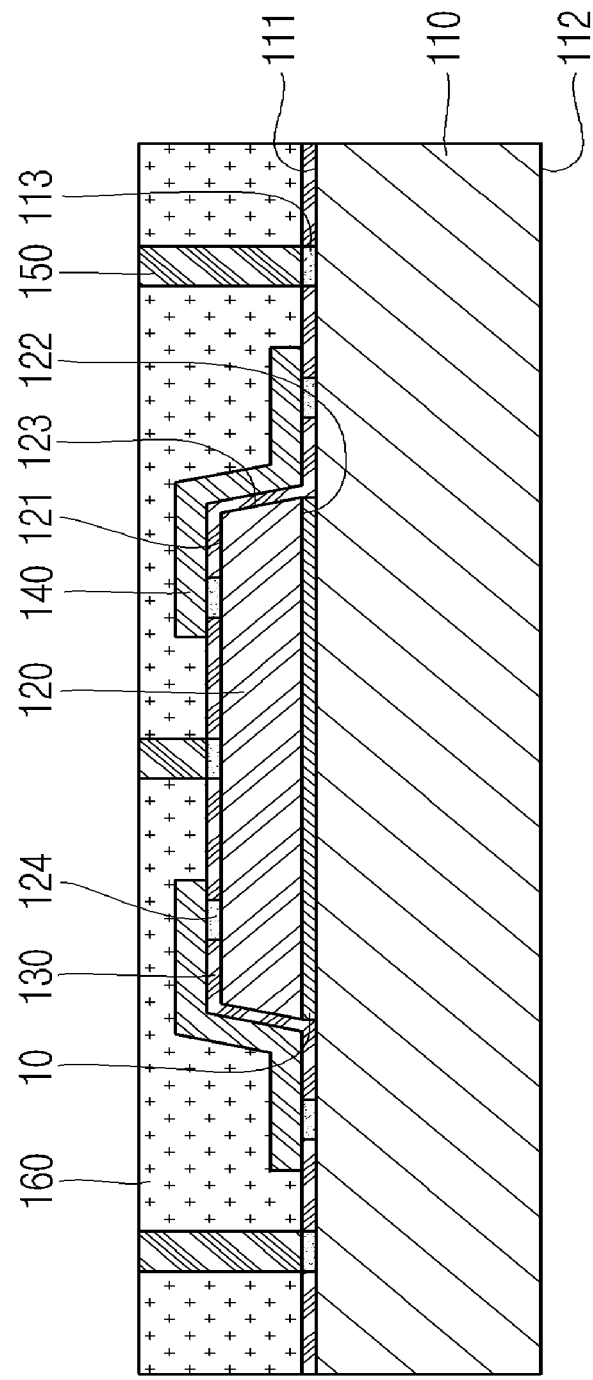

Referring to FIG. 2F, in the grinding operation (S6), a top surface of the encapsulant 160 may be ground, for example using a grinder (not shown). In addition, in the grinding operation (S6), the conductive pillar 150 may also be ground to be exposed to the outside. Here, a portion of the conductive pillar 150 may also be ground together with the encapsulant 160. Therefore, the conductive pillar(s) 150 formed on the first bond pads 113 of the first semiconductor die 110 and the second bond pads 124 of the second semiconductor die 120 may be exposed to the outside of the encapsulant 160 while forming the same plane with the encapsulant 160.

The second redistribution layer forming operation (S7) may comprise forming a second redistribution layer 170 on the conductive pillar 150.

Figure 2G:
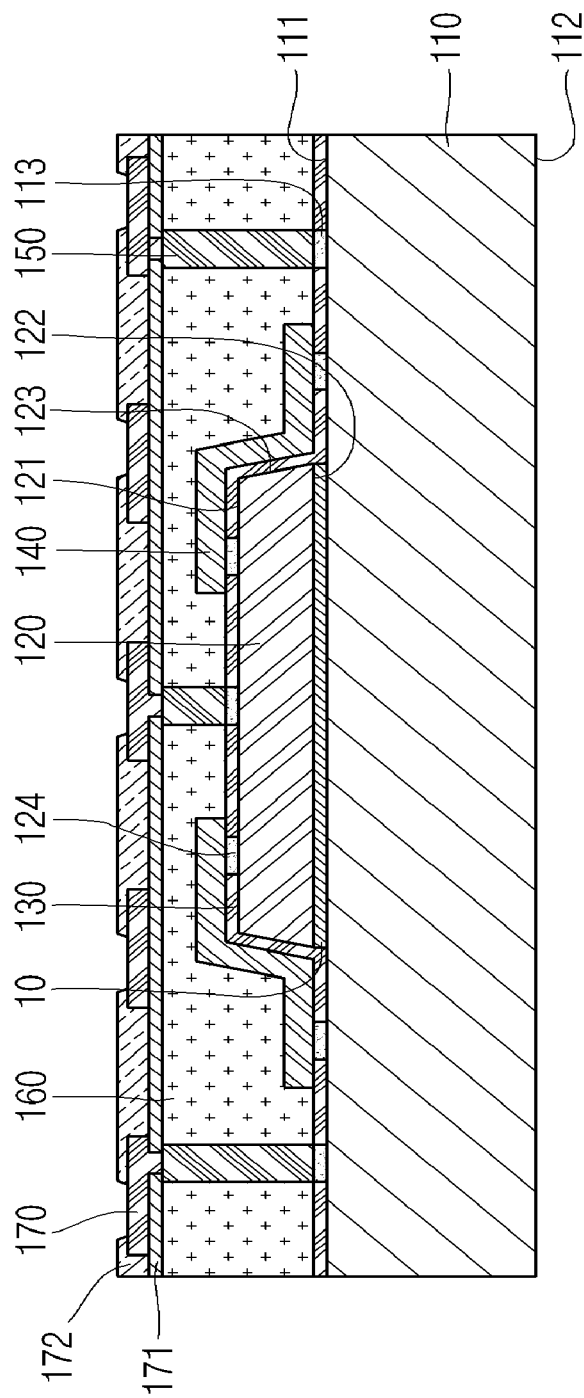

Referring to FIG. 2G, in the second redistribution layer forming operation (S7), a first passivation layer 171 may be first formed on the encapsulant 160 so as to expose a portion of the conductive pillar 150. Next, a second redistribution layer 170 may be formed on the first passivation layer 171 to be electrically connected to the conductive pillar 150. The second redistribution layer 170 may comprise, for example, the same material as the first redistribution layer 140. Lastly, a second passivation layer 172 may be formed on the first passivation layer 171 to cover the second redistribution layer 170. In addition, the second passivation layer 172 may expose a portion of the second redistribution layer 170 to the outside.

In the second redistribution layer forming operation (S7), the second redistribution layer 170 may be formed on the encapsulant 160 to be electrically connected to the conductive pillars 150 exposed to the outside through the grinding operation (S6). Therefore, the second redistribution layer 170 may be electrically connected to the first semiconductor die 110 and the second semiconductor die 120 through respective conductive pillars 150.

The solder ball attaching operation (S8) may comprise attaching solder balls 180 to the second redistribution layer 170.

Figure 2H:
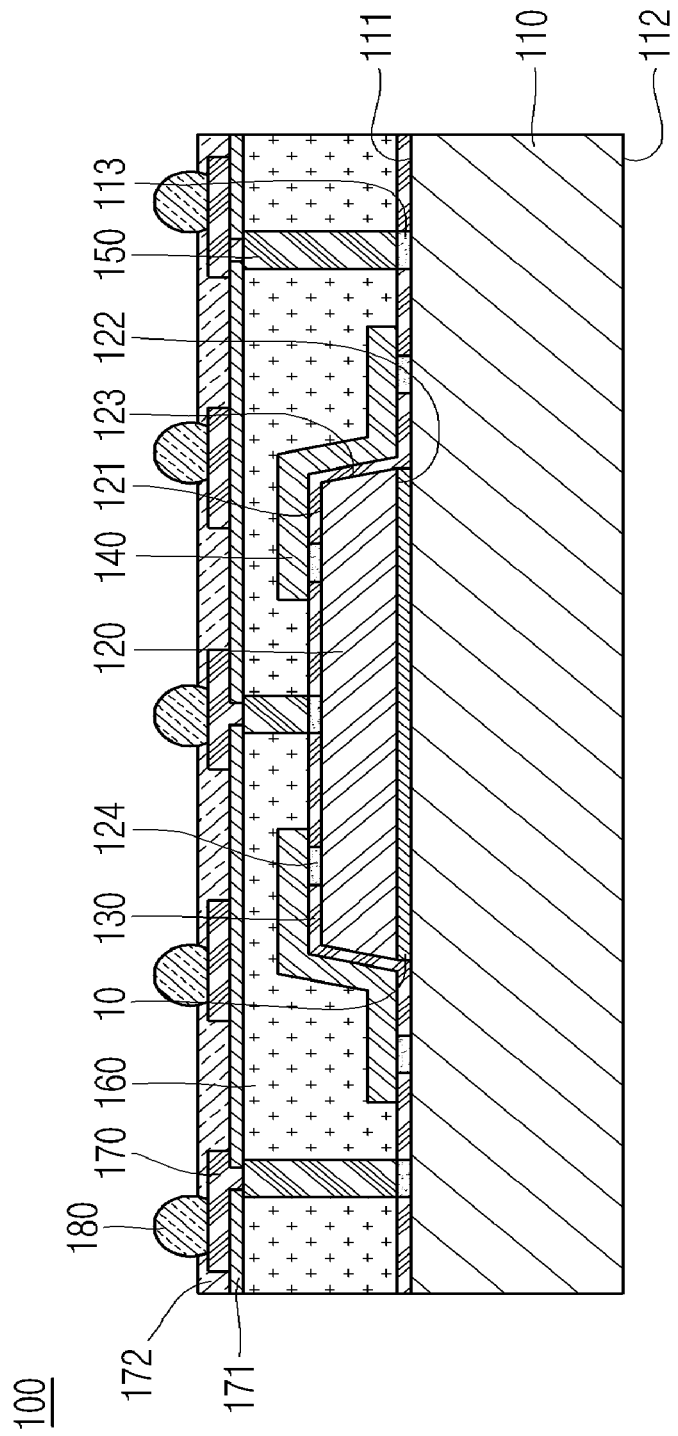

Referring to FIG. 2H, in the solder ball attaching operation (S8), the solder balls 180 may be attached to the second redistribution layer 170 exposed to the outside by the second passivation layer 172. Therefore, the solder balls 180 may be electrically connected to the first semiconductor die 110 and the second semiconductor die 120. In addition, before the solder balls 180 are attached to the second redistribution layer 170 and after an under bump metal (UBM) (not shown) is formed on the second redistribution layer 170, the solder balls 180 may be attached to the UBM. The solder balls 180 may be made of, for example, one material selected from the group consisting of tin/lead, leadless tin and equivalents thereof.

In addition, after the solder ball attaching operation (S8), in order to separate the plurality of second semiconductor die 120 formed on the first semiconductor die 110 in the form of a wafer, the fabricating method may further comprise sawing the first semiconductor die 110. In such a manner, the semiconductor device 100 according to an example embodiment of the present disclosure may be completed.

The thus-fabricated semiconductor device 100 comprises a first semiconductor die 110 having first bond pads 113 formed thereon; a second semiconductor die 120 mounted on the first semiconductor die 110 and having second bond pads 124 formed thereon; a passivation layer 130 formed on the first semiconductor die 110 and the second semiconductor die 120 and exposing the first bond pads 113 and the second bond pads 124 to the outside; a first redistribution layer 140 formed on the passivation layer 130 and electrically connecting one or more of the first bond pads 113 and one or more of the second bond pads 124; a conductive pillar 150 formed on one or more of the first bond pads 113 and/or on one or more of the second bond pads 124, for example on which the first redistribution layer 140 is not formed; an encapsulant 160 encapsulating, on the first semiconductor die 110, the second semiconductor die 120, the passivation layer 130, the first redistribution layer 140 and the conductive pillar 150; and a second redistribution layer 170 formed on the encapsulant 160 and electrically connected to the conductive pillar 150, and solder balls 180 formed on the second redistribution layer 170.

As described above, in the fabricating method of the semiconductor device according to an example embodiment of the present disclosure, the first redistribution layer 140 electrically connecting the first bond pads 113 and the second bond pads 124 may be formed, thereby electrically connecting the first semiconductor die 110 and the second semiconductor die 120. Accordingly, in an example aspect of the present disclosure, a process of applying heat, like in wire bonding or conductive bump attachment, is not required, so that wafer-level operations may be utilized, thereby achieving mass production.

Figure 3:
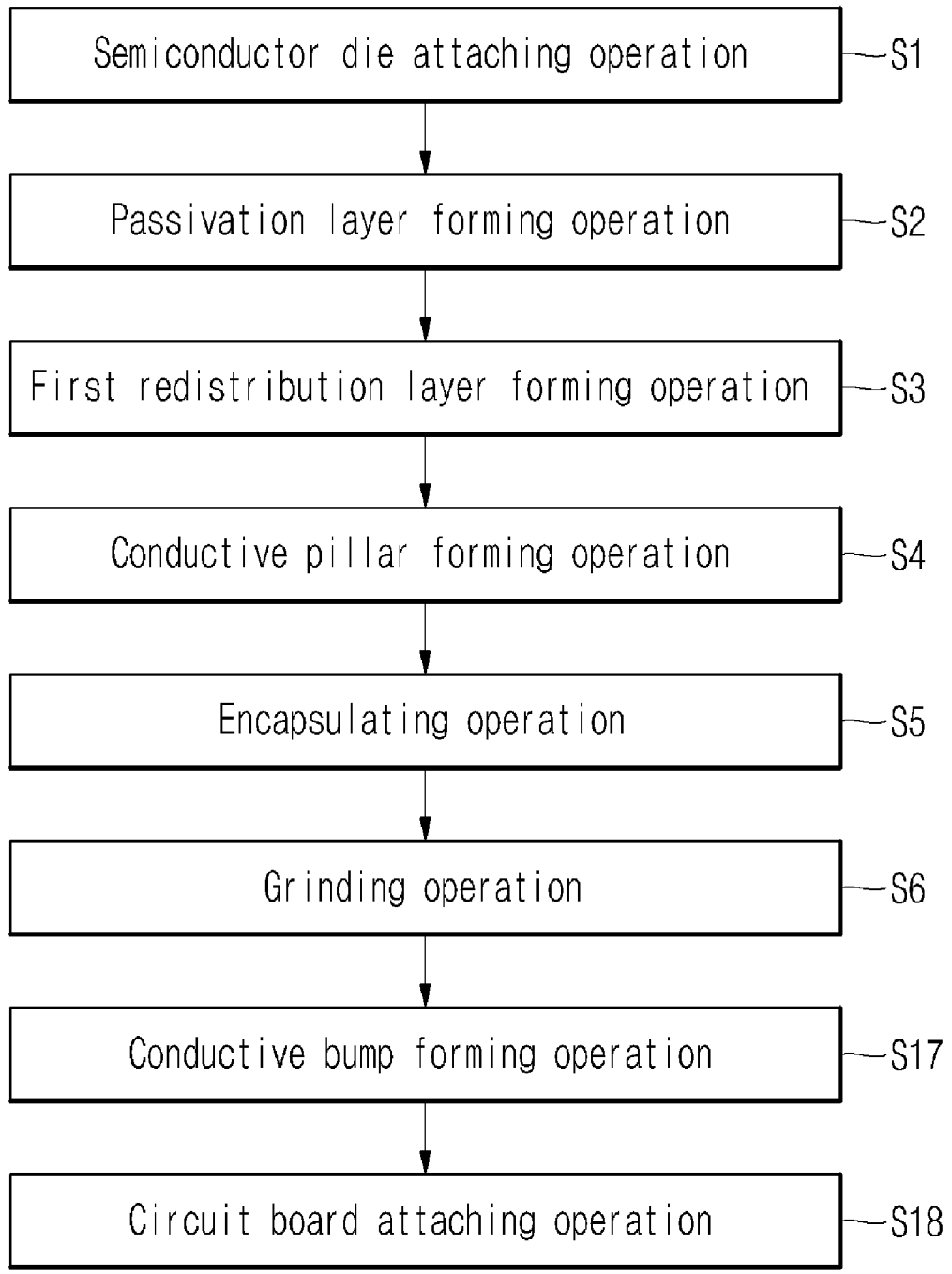
FIG. 3 is a flowchart illustrating a fabricating method of a semiconductor device, in accordance with an example embodiment of the present disclosure.
Figure 4A:
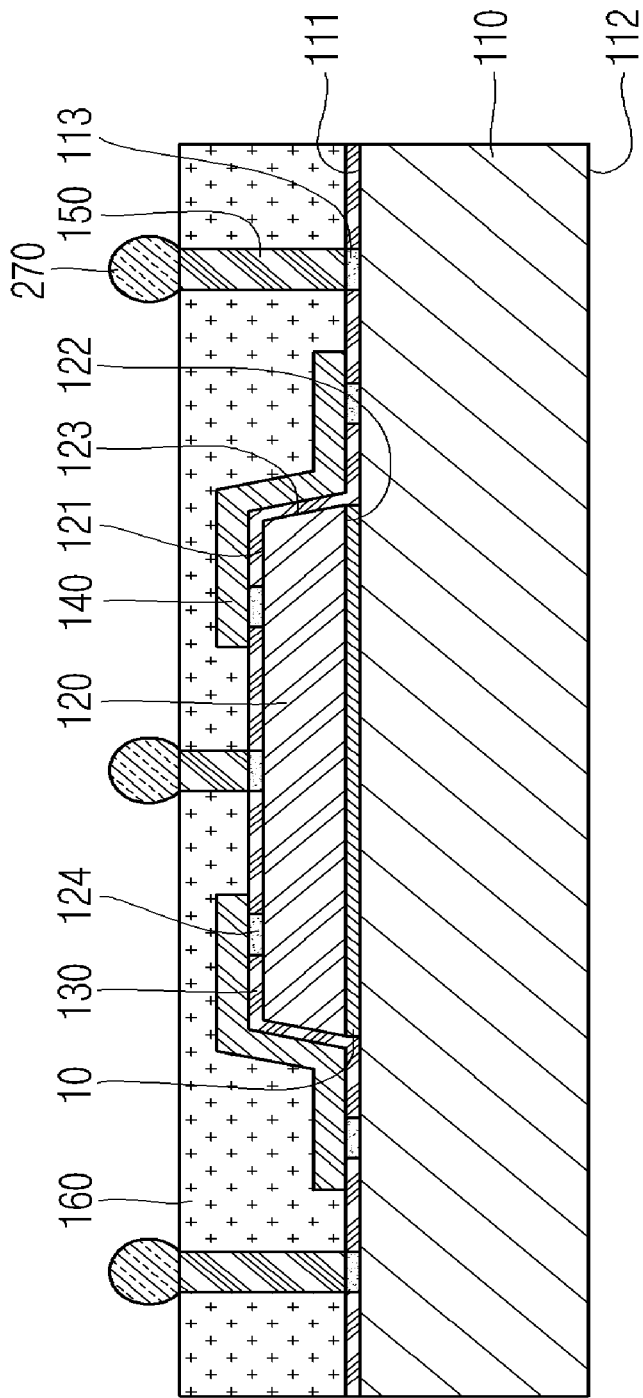
FIGS. 4A and 4B are cross-sectional views illustrating the fabricating method shown in FIG. 3, in accordance with an example embodiment of the present disclosure.
Figure 4B:
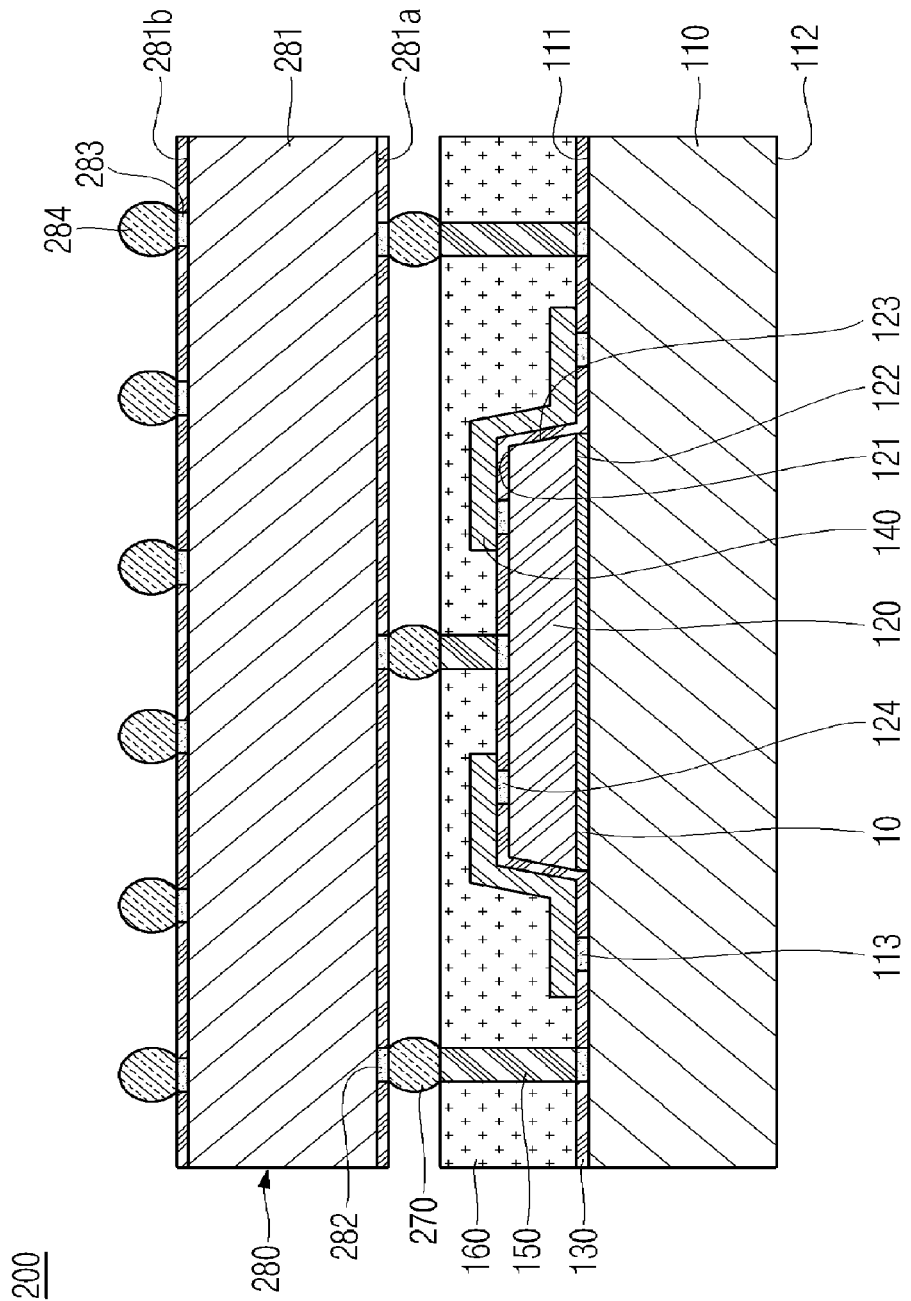

FIG. 3 is a flowchart illustrating a fabricating method of a semiconductor device according to another example embodiment of the present disclosure, and FIGS. 4A and 4B are cross-sectional views illustrating the fabricating method shown in FIG. 3.

Referring to FIG. 3, the fabricating method of the semiconductor device according to another example embodiment of the present disclosure includes a semiconductor die attaching operation (S1), a passivation layer forming operation (S2), a first redistribution layer forming operation (S3), a conductive pillar forming operation (S4), an encapsulating operation (S5), a grinding operation (S6), a conductive bump forming operation (S17) and a circuit board attaching operation (S18). Here, the semiconductor die attaching operation (S1), the passivation layer forming operation (S2), the first redistribution layer forming operation (S3), the conductive pillar forming operation (S4), the encapsulating operation (S5) and the grinding operation (S6) are, in one example embodiment of the disclosure, substantially the same as those shown in FIG. 1, and accordingly detailed descriptions thereof will be omitted. Thus, the following description will focus on only the conductive bump forming operation (S17) and the circuit board attaching operation (S18).

The conductive bump forming operation (S17) may comprise forming conductive bumps 270 on the conductive pillar 150.

Referring to FIG. 4A, in the conductive bump forming operation (S17), the conductive bumps 270 may be formed on the conductive pillar 150 exposed to the outside through the grinding operation (S6). Therefore, the conductive bumps 270 may be electrically connected to the conductive pillar 150. Here, the conductive bumps 270 may be made of, for example, one material selected from the group consisting of tin/lead, leadless tin and equivalents thereof.

The circuit board attaching operation (S18) may comprise attaching a circuit board 280 to the conductive bumps 270.

Referring to FIG. 4B, in the circuit board attaching operation (S18), the circuit board 280 may be prepared, where the circuit board 280 comprises an insulating layer 281, a first circuit pattern 282 formed on a first surface 281a of the insulating layer 281, a second circuit pattern 283 formed on a second surface 282b opposite to the first surface 281a, and solder balls 284 attached to the second circuit pattern 283. Then, the circuit board 280 may be attached to the conductive bumps 270 to electrically connect the first circuit pattern 282 to the conductive bumps 270. The circuit board 280 may be, for example, a printed circuit board (PCB).

In addition, after the circuit board attaching operation (S18), the fabricating method may further comprise sawing the first semiconductor die 110 to separate the plurality of second semiconductor die 120 formed on the first semiconductor die 110 from each other. In such a manner, the semiconductor device 200 can be completed.

The thus-fabricated semiconductor device 200 may comprise a first semiconductor die 110 having first bond pads 113 formed thereon; a second semiconductor die 120 mounted on the first semiconductor die 110 and having second bond pads 124 formed thereon; a passivation layer 130 formed on the first semiconductor die 110 and the second semiconductor die 120 and exposing the first bond pads 113 and the second bond pads 124 to the outside; a first redistribution layer 140 formed on the passivation layer 130 and electrically connecting one or more of the first bond pads 113 and one or more of the second bond pads 124; a conductive pillar 150 formed on the first bond pads 113 and the second bond pads 124, where the first redistribution layer 140 is not formed; an encapsulant 160 encapsulating, on the first semiconductor die 110, the second semiconductor die 120, the passivation layer 130, the first redistribution layer 140 and the conductive pillar 150; conductive bumps 270 formed on the conductive pillar 150; and a circuit board 280 electrically connected to the conductive bumps 270.

Figure 5:
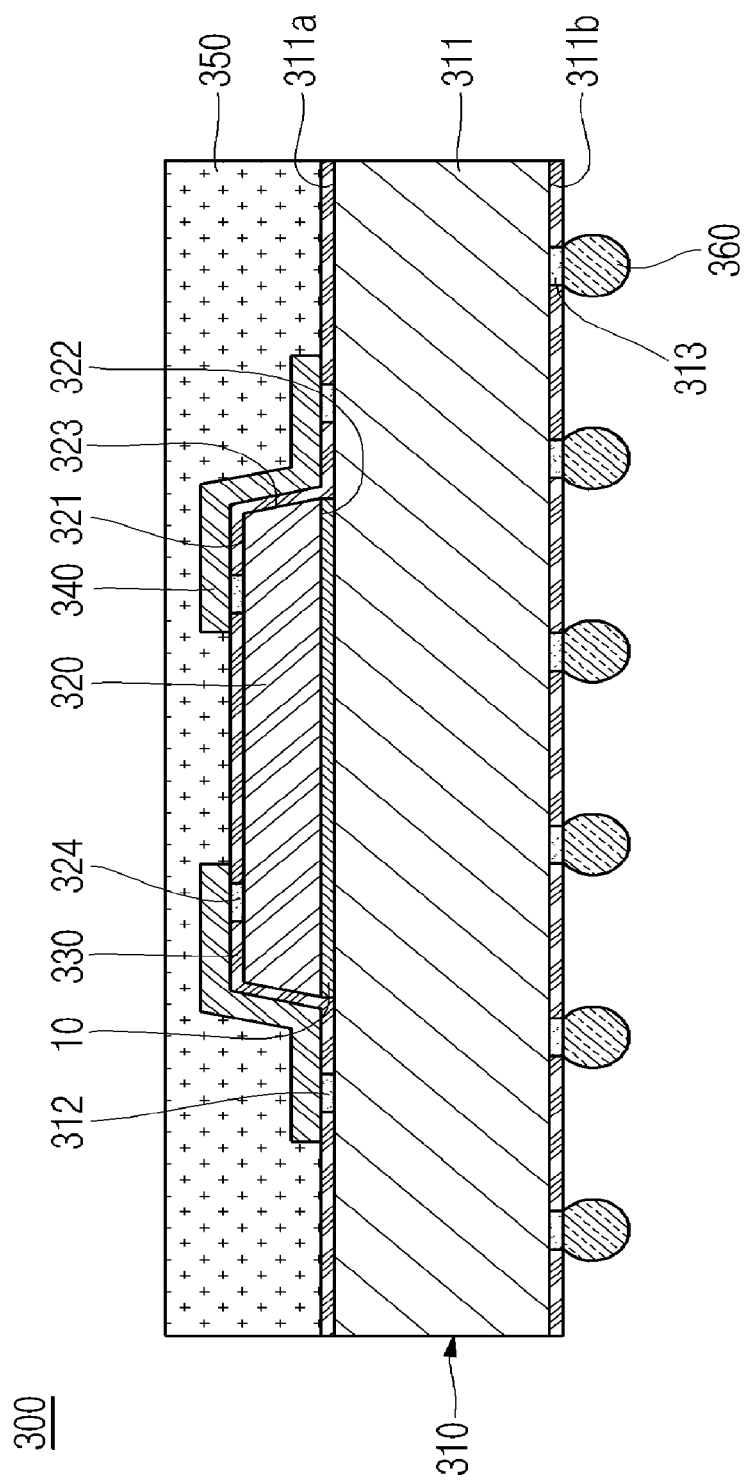
FIG. 5 is a cross-sectional view illustrating a semiconductor device, in accordance with an example embodiment of the present disclosure.

FIG. 5 is a cross-sectional view illustrating a semiconductor device, in accordance with an example embodiment of the present disclosure.

Referring to FIG. 5, the semiconductor device according to still another example embodiment of the present disclosure comprises a circuit board 310, a semiconductor die 320, a passivation layer 330, a redistribution layer 340, an encapsulant 350 and solder balls 360.

The circuit board 310 may comprise a PCB with an insulating layer 311, a first circuit pattern 312 formed on a first surface 311a of the insulating layer 311, and a second circuit pattern 313 formed on a second surface 311b opposite to the first surface 311a. In addition, the first circuit pattern 312 and the second circuit pattern 313 may be electrically connected using a through-silicon via (not shown).

The semiconductor die 320 may comprise silicon, for example, and may be, for example, a memory chip having a plurality of semiconductor devices formed therein. The semiconductor die 320 may comprise a first surface 321 that is planar, a second surface 322 that is planar and opposite to the first surface 321, an inclined surface 323 connecting the first surface 321 and the second surface 322 and formed to be inclined, and a plurality of bond pads 324 formed on the first surface 321. That is to say, the semiconductor die 320 may be trapezoidal with the the second surface 322 being wider than the first surface 321. The semiconductor die 320 may be attached to the first surface 311a of the circuit board 310 using an adhesion member 10 (e.g., adhesive paste, adhesive tape, etc.).

The passivation layer 330 is formed to cover the first surface 311a of the circuit board 310, and the first surface 321 and the inclined surface 323 of the semiconductor die 320. In addition, the passivation layer 330 exposes the first circuit pattern 312 of the circuit board 310 and the bond pads 324 of the semiconductor die 320 to the outside. The passivation layer 330 may be generally made of, for example, one material selected from the group consisting of polyimide, epoxy, benzo cyclo butane (BCB), poly benz oxazole (PBO), oxide, nitride, and equivalents thereof.

The redistribution layer 340 may electrically connect the first circuit pattern 312 of the circuit board 310 to the bond pads 324 of the semiconductor die 320. That is to say, the redistribution layer 340 may be formed on a top surface of the passivation layer 330 to extend from the first surface 311a of the circuit board 310 to the inclined surface 323 and the first surface 321 of the semiconductor die 320. Therefore, the redistribution layer 340 may be formed to have a stepped portion. Here, since the semiconductor die 320 has the inclined surface 323, the redistribution layer 340 may be efficiently formed on the top surface of the passivation layer 330. The redistribution layer 340 may be made of, for example, one material selected from the group consisting of copper (Cu), titanium (Ti), nickel (Ni), palladium (Pd) and equivalents thereof.

The encapsulant 350 may encapsulate the semiconductor die 320, the passivation layer 330 and the redistribution layer 340, on the circuit board 310. That is to say, the encapsulant 350 may encapsulate the semiconductor die 320, the passivation layer 330 and the redistribution layer 340, which may be positioned on the circuit board 310, thereby protecting these components from external surroundings. The encapsulant 350 may be made of, for example, an epoxy-based resin.

The solder balls 360 are attached to the second circuit pattern 313 of the circuit board 310. Therefore, the solder balls 360 are electrically connected to the circuit board 310 and the semiconductor die 320. In addition, before the solder balls 360 are attached to the second circuit pattern 313 and after an under bump metal (UBM) (not shown) is formed on the second circuit pattern 313, the solder balls 360 may be attached to the UBM. The solder balls 360 may be made of, for example, one material selected from the group consisting of tin/lead, leadless tin and equivalents thereof.

As described above, the semiconductor device 300 according to still another example embodiment of the present disclosure comprises the redistribution layer 340 electrically connecting the first circuit pattern 312 and the bond pads 324, thereby electrically connecting the circuit board 310 and the semiconductor die 320. Accordingly, in accordance with an example aspect of the present disclosure, a process of applying heat, like in wire bonding or conductive bump attachment, is not required, so that panel-level operations may be utilized, thereby efficiently achieving mass production.

Figure 6:
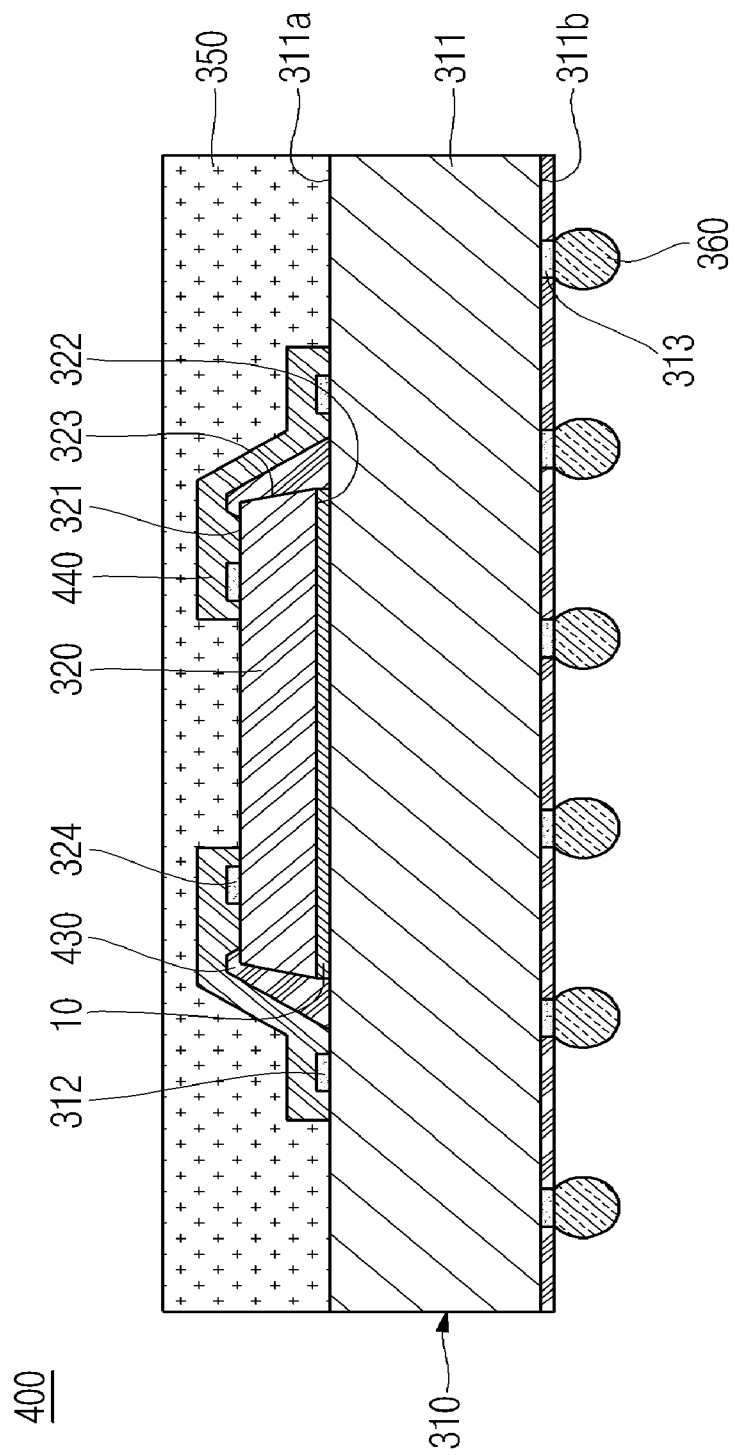
FIG. 6 is a cross-sectional view illustrating a semiconductor device, in accordance with an example embodiment of the present disclosure.

FIG. 6 is a cross-sectional view illustrating a semiconductor device, in accordance with an example embodiment of the present disclosure.

The semiconductor device shown in FIG. 6 is substantially the same as the semiconductor device shown in FIG. 5, and the following description will focus on differences there between.

Referring to FIG. 6, the semiconductor device 400 according to still another example embodiment of the present disclosure comprises a circuit board 310, a semiconductor die 320, a passivation layer 430, a redistribution layer 440, an encapsulant 350 and solder balls 360.

The passivation layer 430 may, for example, be formed to surround an inclined surface 323 of the semiconductor die 320. In addition, the passivation layer 430 may be formed to extend over a portion of a first surface 321 of the semiconductor die 320 and a portion of a first surface 311a of the circuit board 310. That is to say, the passivation layer 430 may be formed only around the inclined surface 323, corresponding to an edge portion of the semiconductor die 320.

The redistribution layer 440 may electrically connect the first circuit pattern 312 of the circuit board 310 and the bond pads 324 of the semiconductor die 320. The redistribution layer 440 may for example be formed to extend from the first surface 311a of the circuit board 310 to the inclined surface 323 and the first surface 321 of the semiconductor die 320. Therefore, the redistribution layer 440 may for example be formed to completely cover the passivation layer 430 formed on the inclined surface 323 of the semiconductor die 320.

As described above, in the semiconductor device 400 according to still another example embodiment of the present disclosure, the passivation layer 430 may be formed only around the inclined surface 323, corresponding to an edge portion of the semiconductor die 320, thereby reducing the fabrication cost.

Figure 7:
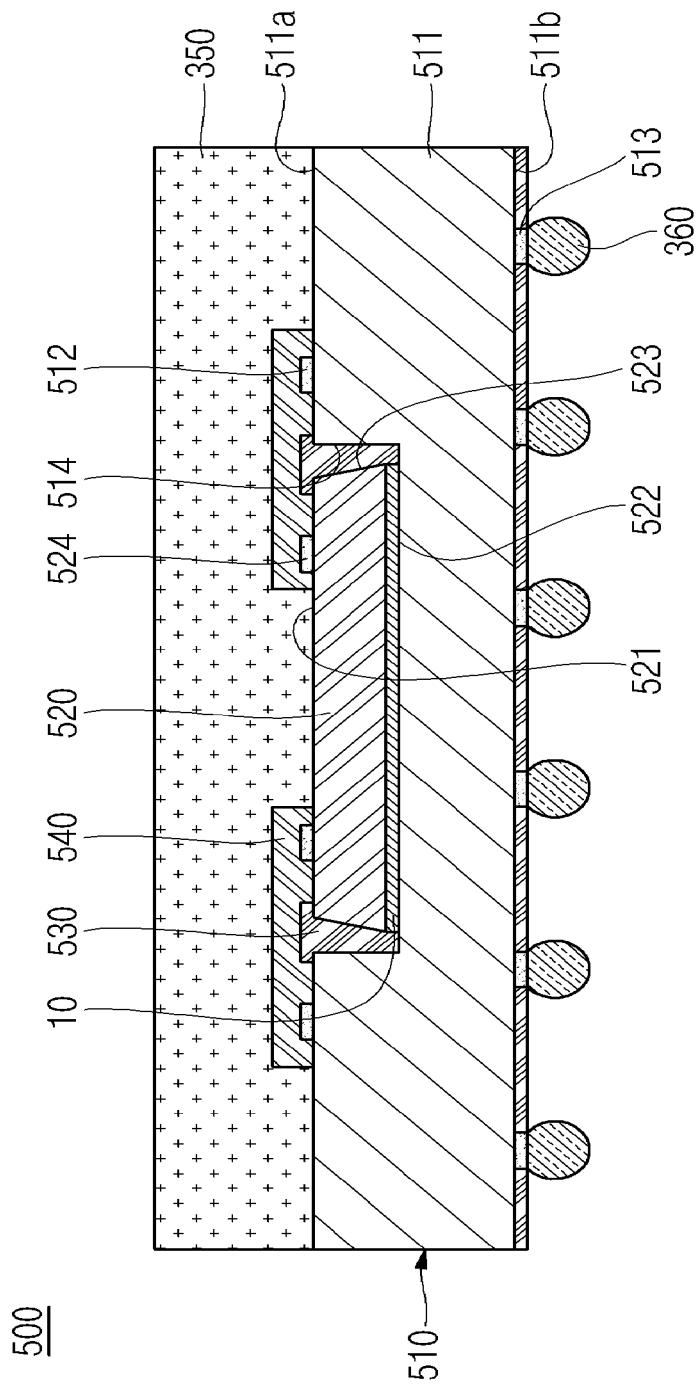
FIG. 7 is a cross-sectional view illustrating a semiconductor device, in accordance with an example embodiment of the present disclosure.

FIG. 7 is a cross-sectional view illustrating a semiconductor device, in accordance with an example embodiment of the present disclosure.

The semiconductor device shown in FIG. 7 is substantially the same as the semiconductor device shown in FIG. 5, and the following description will focus on differences there between.

Referring to FIG. 7, the semiconductor device 500 according to still another example embodiment of the present disclosure may comprise a circuit board 510, a semiconductor die 520, a passivation layer 530, a redistribution layer 540, an encapsulant 350 and solder balls 360.

The circuit board 510 may comprise, for example, a PCB and includes an insulating layer 511, a first circuit pattern 512 formed on a first surface 511a of the insulating layer 511, and a second circuit pattern 513 formed on a second surface 511b opposite to the first surface 511a. In addition, the circuit board 510 may further comprise a mounting groove 514 formed on the first surface 511a of the insulating layer 511. The semiconductor die 520 may be mounted in the mounting groove 514. The mounting groove 514 may be formed at the center of the circuit board 510. In addition, a depth of the mounting groove 514 may be equal to a height of the semiconductor die 520. In addition, a width of the mounting groove 514 may be greater than that of the semiconductor die 520.

The semiconductor die 520 may comprise, for example, silicon, and may be, for example, a memory chip having a plurality of semiconductor devices formed therein. The semiconductor die 520 may comprise a first surface 521 that is planar, a second surface 522 that is planar and opposite to the first surface 521, an inclined surface 523 connecting the first surface 521 and the second surface 522, and a plurality of bond pads 524 formed on the first surface 521. That is to say, the semiconductor die 520 may be trapezoidal with the second surface 522 being wider than the first surface 521. Alternatively for example, the semiconductor die 520 may also be rectangular, for example having the surface 523 formed at a right angle to the first surface 521 and second surface 522. The semiconductor die 520 may be mounted in the mounting groove 514 of the circuit board 510. Here, the semiconductor die 520 may be adhered to the mounting groove 514 using an adhesion member 10 (e.g., adhesive paste, adhesive tape, etc.). In addition, since the height of the semiconductor die 520 may be equal to the depth of the mounting groove 514, the first surface 521 of the semiconductor die 520 and a first surface 511a of the circuit board 510 may be coplanar. Further, since the width of the semiconductor die 520 may be smaller than that of the mounting groove 514, a lateral space may be formed between the semiconductor die 520 and the mounting groove 514.

The passivation layer 530 may be formed between the semiconductor die 520 and the circuit board 510. In detail, the passivation layer 530 may be formed to fill the lateral space between the inclined surface 523 of the semiconductor die 520 and the mounting groove 514 of the circuit board 510. In addition, the passivation layer 530 may be formed to cover a portion (e.g., an edge perimeter portion) of the first surface 521 of the semiconductor die 520 and a portion of the first surface 511a of the circuit board 510.

The redistribution layer 540 may electrically connect the first circuit pattern 512 of the circuit board 510 and the bond pads 524 of the semiconductor die 520. The redistribution layer 540 may be formed to extend from the first surface 511a of the circuit board 510 to the passivation layer 530 and the first surface 521 of the semiconductor die 520. In addition, since the circuit board 510 and the semiconductor die 520 may be coplanar, the redistribution layer 540 may be planarized without a stepped portion. Therefore, the redistribution layer 540 may achieve a fine pattern width and may increase the number of patterns.

Figure 8:
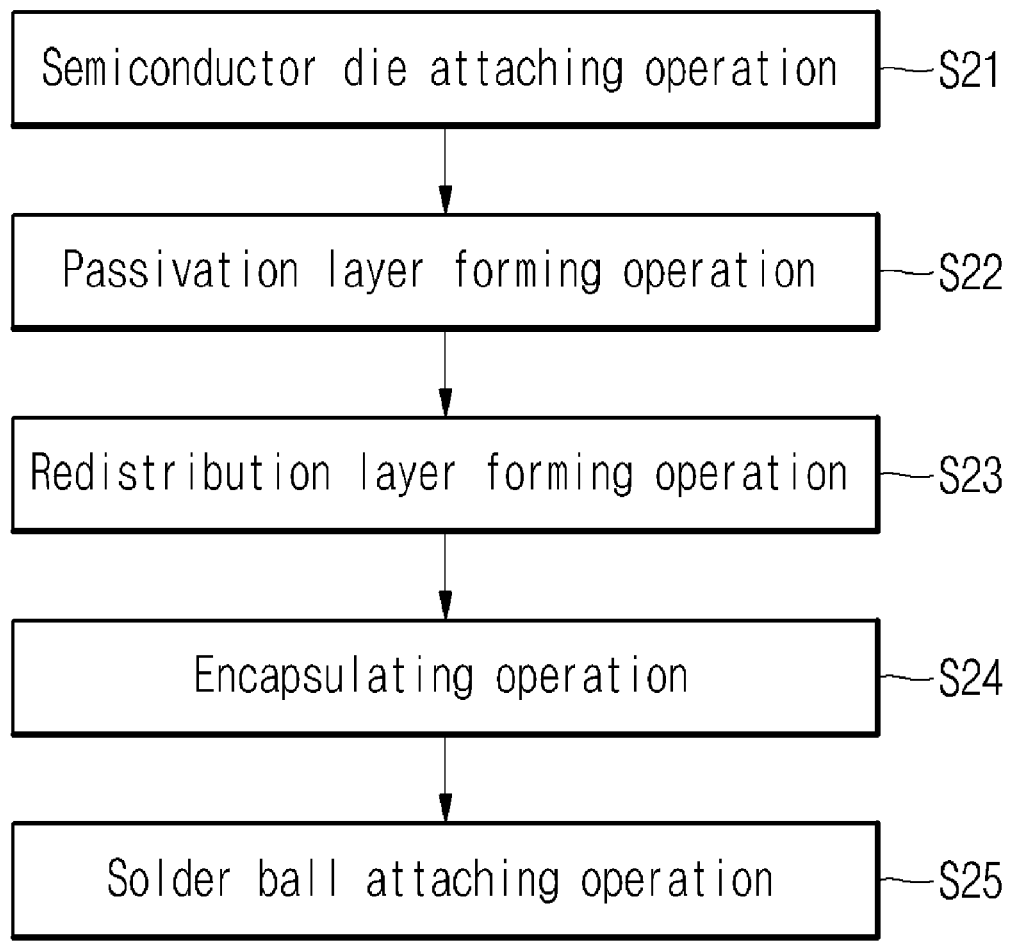
FIG. 8 is a flowchart illustrating a fabricating method of a semiconductor device, in accordance with an example embodiment of the present disclosure.

FIG. 8 is a flowchart illustrating a fabricating method of a semiconductor device, in accordance with an example embodiment of the present disclosure, and FIGS. 9A to 9E are cross-sectional views illustrating the fabricating method shown in FIG. 8.

Referring to FIG. 8, the fabricating method of the semiconductor device according to still another example embodiment of the present disclosure may comprise a semiconductor die attaching operation (S21), a passivation layer forming operation (S22), a redistribution layer forming operation (S23), an encapsulating operation (S24) and a solder ball attaching operation (S25). Hereinafter, various operations illustrated in FIG. 8 will be described with reference to FIGS. 9A to 9E.

The semiconductor die attaching operation (S21) may comprise attaching a semiconductor die 320 to a first surface 311a of a circuit board 310.

Figure 9A:
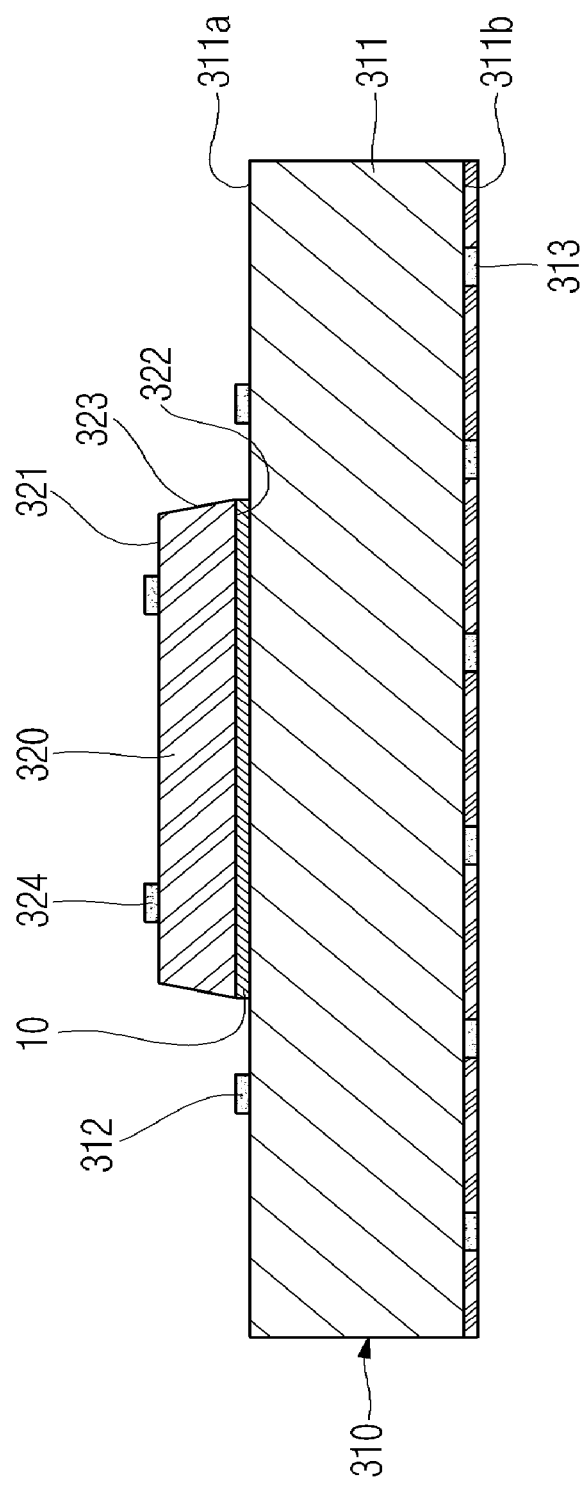
FIGS. 9A to 9E are cross-sectional views illustrating the fabricating method shown in FIG. 8, in accordance with an example embodiment of the present disclosure.

Referring to FIG. 9A, in the semiconductor die attaching operation (S21), the semiconductor die 320 may be attached to the first surface 311a of the circuit board 310 using an adhesion member 10 (e.g., adhesive paste, adhesive tape, etc.). In FIG. 9A, one semiconductor die 320 attached to the circuit board 310 is illustrated. In practice, however, a plurality of semiconductor die 320 may be attached to the circuit board 310 in the form of a panel. That is to say, the semiconductor die attaching operation (S21) may comprise attaching a plurality of second semiconductor die 320 to the first surface 311a of the circuit board 310 in the form of a panel.

The circuit board 310 may for example comprise a PCB with an insulating layer 311, a first circuit pattern 312 formed on a first surface 311a of the insulating layer 311, and a second circuit pattern 313 formed on a second surface 311b opposite to the first surface 311a. In addition, the semiconductor die 320 may comprise, for example, silicon, and may be, for example, a memory chip having a plurality of semiconductor devices formed therein. The semiconductor die 320 may comprise a first surface 321 that is planar, a second surface 322 that is planar and opposite to the first surface 321, an inclined surface 323 connecting the first surface 321 and the second surface 322 and formed to be inclined, and a plurality of bond pads 324 formed on the first surface 321. That is to say, the semiconductor die 320 may be trapezoidal with the second surface 322 being wider than the first surface 321. In the semiconductor die attaching operation (S21), the circuit board 310 and the semiconductor die 320 may be attached to each other such that the second surface 322 of the semiconductor die 320 faces the first surface 311a of the circuit board 310.

The passivation layer forming operation (S22) may comprise forming a passivation layer 330 on the first surface 311a of the circuit board 310 and the first surface 321 of the semiconductor die 320.

Figure 9B:
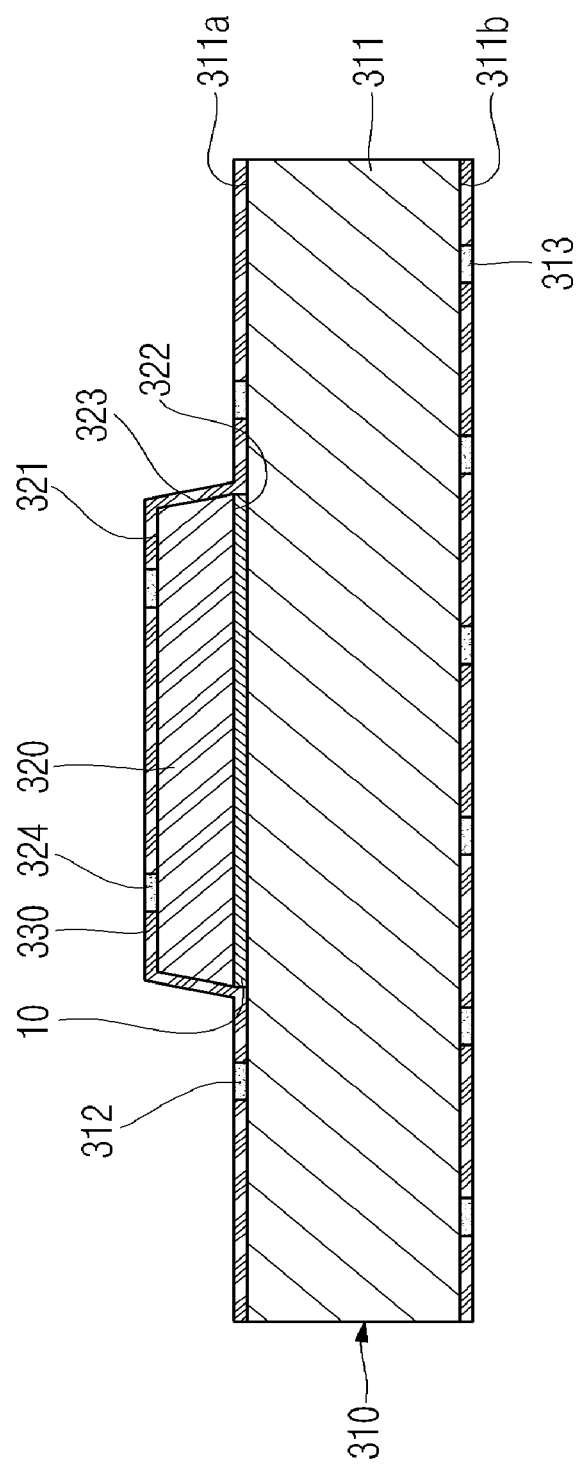

Referring to FIG. 9B, in the passivation layer forming operation (S22), the passivation layer 330 may be formed to cover the first surface 311a of the circuit board 310 and the first surface 321 and the inclined surface 323 of the semiconductor die 320. In addition, the passivation layer 330 may expose the first circuit pattern 312 and the bond pads 324 to the outside. The passivation layer 330 may be generally made of, for example, one material selected from the group consisting of polyimide, epoxy, benzo cyclo butane (BCB), poly benz oxazole (PBO), oxide, nitride, and equivalents thereof.

The redistribution layer forming operation (S23) may comprise forming a redistribution layer 340 electrically connecting the bond pads 324 of the semiconductor die 320 to the first circuit pattern 312 of the circuit board 310.

Figure 9C:
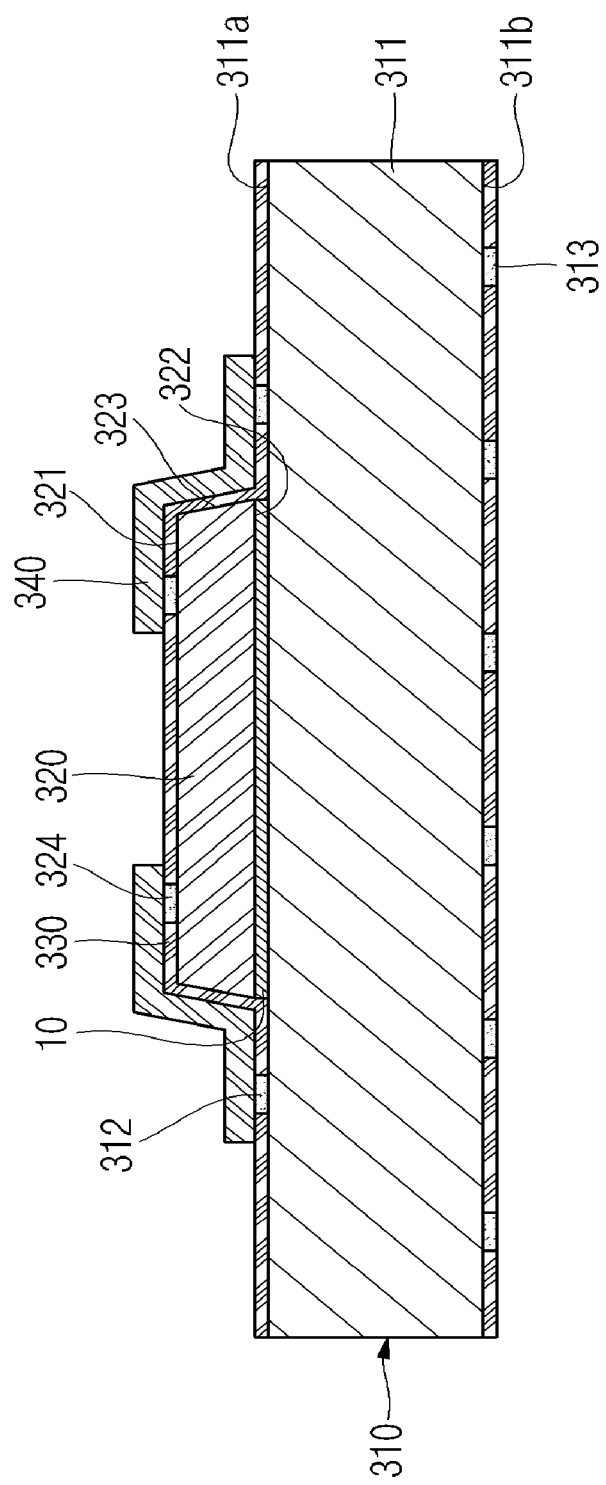

Referring to FIG. 9C, in the redistribution layer forming operation (S23), the redistribution layer 340 may be formed on a top surface of the passivation layer 330 to electrically connect the bond pads 324 to the first circuit pattern 312. The redistribution layer 340 may be formed on the top surface of the passivation layer 330 to extend from the first surface 311a of the circuit board 310 to the inclined surface 323 and the first surface 321 of the semiconductor die 320. In addition, a seed layer (not shown) may be formed between the redistribution layer 340 and the passivation layer 330. The redistribution layer 340 may comprise, for example, a material selected from the group consisting of copper (Cu), titanium (Ti), nickel (Ni), palladium (Pd) and equivalents thereof.

The encapsulating operation (S24) may comprise encapsulating the semiconductor die 320, the passivation layer 330 and the redistribution layer 340, which may be positioned on the circuit board 310, using an encapsulant 350.

Figure 9D:
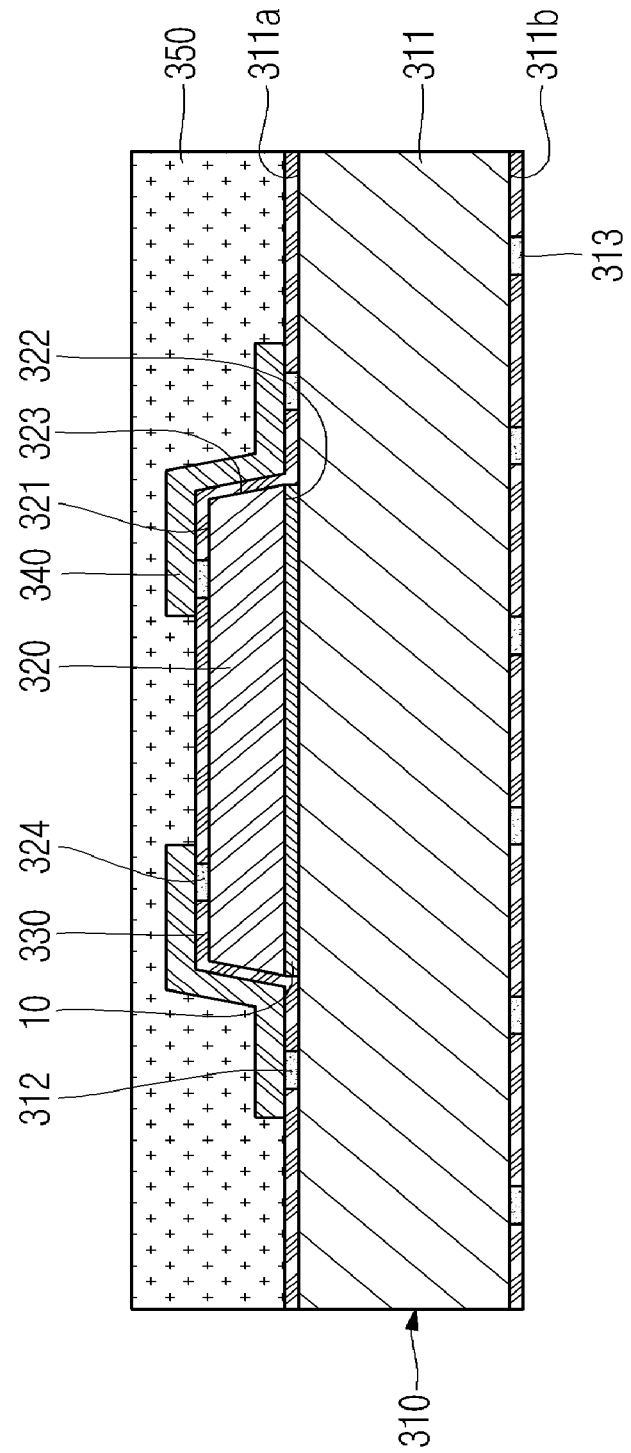

Referring to FIG. 9D, in the encapsulating operation (S24), the semiconductor die 320, the passivation layer 330 and the redistribution layer 340, which may be positioned on the circuit board 310, may be encapsulated using the encapsulant 360, thereby protecting these components from external surroundings. The encapsulant 350 may be made of, for example, an epoxy-based resin.

The solder ball attaching operation (S25) may comprise attaching the solder balls 360 to the second circuit pattern 313 of the circuit board 310.

Figure 9E:
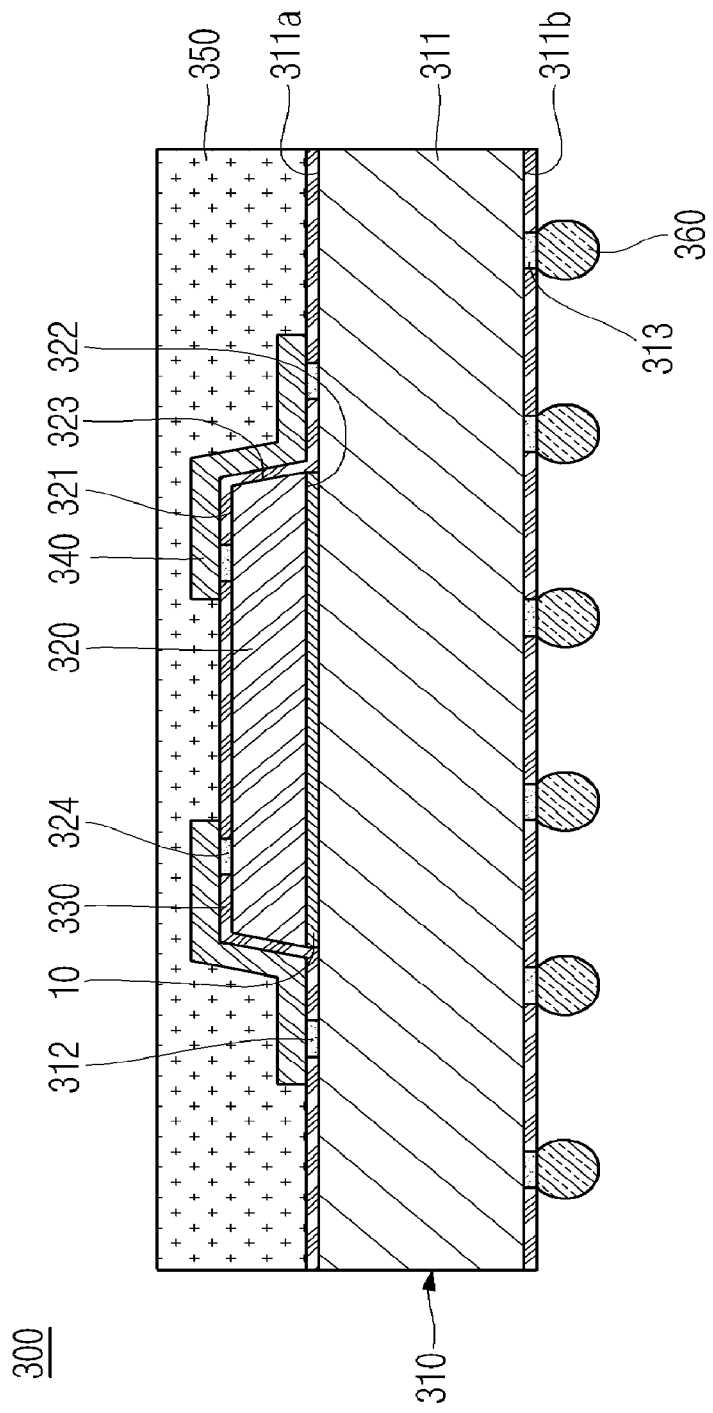

Referring to FIG. 9E, in the solder ball attaching operation (S25), the solder balls 360, which may comprise, for example, a material selected from the group consisting of tin/lead, leadless tin and equivalents thereof, and may be attached to the second circuit pattern 313 of the circuit board 310. The solder balls 360 may serve to transfer electrical signals between the semiconductor die 320 and an external circuit.

In addition, after the solder ball attaching operation (S25), the fabricating method may further comprise sawing the circuit board 310 to separate the plurality of semiconductor die 320 formed on the circuit board 310 in the form of a panel from each other. In such a manner, the semiconductor device 300 according to still another example embodiment of the present disclosure may be completed.

This disclosure provides example embodiments supporting the present invention. The scope of the present invention is not limited by these example embodiments. Numerous variations, whether explicitly provided for by the specification or implied by the specification, such as variations in structure, dimension, type of material and manufacturing process, may be implemented by one skilled in the art in view of this disclosure.

In an example embodiment of the disclosure a semiconductor device utilizing redistribution layers to couple stacked die is disclosed and may comprise a first semiconductor die with a first surface comprising bond pads, a second surface opposite the first surface, and sloped sides surfaces between the first and second surfaces, such that a cross-section of the first semiconductor die is trapezoidal in shape. A second semiconductor die or a circuit board with a first surface may be bonded to the second surface of the first semiconductor die, wherein the first surface of the second semiconductor die may comprise bond pads.

A passivation layer may be formed on the first surface and sloped side surfaces of the first semiconductor die and the first surface of the second semiconductor die or circuit board. A redistribution layer may be formed on the passivation layer formed on the first surface and sloped side surfaces of the first semiconductor die and the first surface of the second semiconductor die or circuit board, with the redistribution layer electrically coupling at least one bond pad on the first surface of the first semiconductor die to a bond pad on the first surface of the second semiconductor die. An encapsulant material may encapsulate the first semiconductor die, the redistribution layer, and the first surface of the second semiconductor die.

A second redistribution layer may be formed on the encapsulant material. A conductive pillar may extend from a bond pad on the first surface of the second semiconductor die to the second redistribution layer. A solder ball may be formed on the second redistribution layer. A conductive pillar may extend from a bond pad on the first surface of the second semiconductor die to a top surface of the encapsulant material. A solder ball may be formed on the conductive pillar at the top surface of the encapsulant material. A circuit board may be electrically coupled to the bond pad on the first surface of the second semiconductor utilizing the solder ball and the conductive pillar.

While various aspects supporting the invention have been described with reference to certain example embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular example embodiments disclosed, but that the present invention will include all embodiments falling within the scope of the appended claims.

What is claimed is:

1. A semiconductor device comprising:
    a first semiconductor die with a first surface comprising bond pads, a second surface opposite the first surface, and sloped side surfaces between the first and second surfaces, such that a cross-section of the first semiconductor die is trapezoidal in shape;
    a second semiconductor die with a first surface bonded to the second surface of the first semiconductor die, said first surface of the second semiconductor die comprising bond pads;
    a passivation layer formed on the first surface and sloped side surfaces of the first semiconductor die and the first surface of the second semiconductor die;
    a redistribution layer formed on the passivation layer formed on the first surface and sloped side surfaces of the first semiconductor die and the first surface of the second semiconductor die, said redistribution layer electrically coupling at least one bond pad on the first surface of the first semiconductor die to a bond pad on the first surface of the second semiconductor die; and
    an encapsulant material encapsulating the first semiconductor die, the redistribution layer, and the first surface of the second semiconductor die.

2. The semiconductor device according to claim 1, wherein a second redistribution layer is formed on the encapsulant material.

3. The semiconductor device according to claim 2, wherein a conductive pillar extends from a bond pad on the first surface of the second semiconductor die to the second redistribution layer.

4. The semiconductor device according to claim 3, wherein a solder ball is formed on the second redistribution layer.

5. The semiconductor device according to claim 1, wherein a conductive pillar extends from a bond pad on the first surface of the second semiconductor die to a top surface of the encapsulant material.

6. The semiconductor device according to claim 5, wherein a solder ball is formed on the conductive pillar at the top surface of the encapsulant material.

7. The semiconductor device according to claim 6, wherein a circuit board is electrically coupled to the bond pad on the first surface of the second semiconductor die utilizing the solder ball and the conductive pillar.

8. A semiconductor device comprising:
    a first semiconductor die with a first surface comprising bond pads, a second surface opposite the first surface, and sloped sides surfaces between the first and second surfaces, such that a cross-section of the first semiconductor die is trapezoidal in shape;
    a circuit board with a first surface bonded to the second surface of the first semiconductor die, said first surface of the circuit board comprising bond pads;
    a passivation layer formed on the first surface and sloped side surfaces of the first semiconductor die and the first surface of the circuit board;
    a redistribution layer formed on the passivation layer formed on the first surface and sloped side surfaces of the first semiconductor die and the first surface of the circuit board, said redistribution layer electrically coupling at least one bond pad on the first surface of the first semiconductor die to a bond pad on the first surface of the circuit board; and
    an encapsulant material encapsulating the first semiconductor die, the redistribution layer, and the first surface of the circuit board.

9. The semiconductor device according to claim 8, wherein solder balls are formed on a second surface of the circuit board opposite to the first surface of the circuit board.

10. The semiconductor device according to claim 8, wherein bond pads on the first surface of the first semiconductor die are embedded within the passivation layer.

11. The semiconductor device according to claim 8, wherein the bond pads on the circuit board are embedded within the passivation layer on the first surface of the circuit board.

12. The semiconductor device according to claim 8, comprising a first conductive pillar that extends from one of the bond pads on the circuit board to a top surface of the encapsulant material.

13. The semiconductor device according to claim 12, comprising a first solder ball that is formed on the first conductive pillar.

14. The semiconductor device according to claim 13, comprising a second conductive pillar that extends from a bond pad on the first surface of the semiconductor die to the top surface of the encapsulant material.

15. The semiconductor device according to claim 14, comprising a second solder ball that is formed on the second conductive pillar at the top surface of the encapsulant material.

16. The semiconductor device according to claim 15, comprising a second circuit board, a first surface of which is electrically coupled to the first and second solder balls.

17. The semiconductor device according to claim 16, comprising bond pads on the first surface of the second surface board to which the first and second solder balls are electrically coupled.

18. The semiconductor device according to claim 16, comprising a third solder ball that is formed on a second surface of the second circuit board opposite the first surface of the second circuit board.

19. The semiconductor device according to claim 18, wherein the third solder ball is in contact with a circuit pattern on the second surface of the second circuit board.

20. The semiconductor device according to claim 19, comprising an insulating layer that is formed on the second surface of the second circuit board.

\* \* \* \* \*